US012757642B2

(12) United States Patent
Redaelli et al.

(10) Patent No.: US 12,757,642 B2
(45) Date of Patent: Oct. 6, 2026

(54) PROCESS FOR COINTEGRATION OF TWO PHASE CHANGE MEMORY (PCM) ARRAYS HAVING DIFFERENT PHASE CHANGE MATERIALS, AND IN-MEMORY COMPUTATION SYSTEM UTILIZING THE TWO PCM ARRAYS

(71) Applicant: STMicroelectronics International N.V., Geneva (CH)

(72) Inventors: Andrea Redaelli, Milan (IT); Luca Laurin, Lissone (IT)

(73) Assignee: STMicroelectronics International N.V., Geneva (CH)

( * ) Notice: Subject to any disclaimer, the term of this patent is extended or adjusted under 35 U.S.C. 154(b) by 458 days.

(21) Appl. No.: 18/228,736

(22) Filed: Aug. 1, 2023

(65) Prior Publication Data

US 2025/0048940 A1 Feb. 6, 2025

(51) Int. Cl.
*H10N 70/20* (2023.01)
*G11C 13/00* (2006.01)
(Continued)

(52) U.S. Cl.
CPC ....... *H10N 70/231* (2023.02); *G11C 13/0004* (2013.01); *G11C 13/004* (2013.01);
(Continued)

(58) Field of Classification Search
CPC .................................................. H10N 70/231
See application file for complete search history.

(56) References Cited

U.S. PATENT DOCUMENTS 10,673,440 B1 * 6/2020 Camarota ............... G06F 7/483
11,227,992 B2 1/2022 Cappelletti
(Continued)

FOREIGN PATENT DOCUMENTS

EP 2034536 A1 3/2009

OTHER PUBLICATIONS

Ambrogio, Stefano, et al.: "Unsupervised Learning by Spike Timing Dependent Plasticity in Phase Change Memory (PCM) Synapses," Frontiers in Neuroscience, vol. 10, Article 56, Mar. 2016, 12 pgs.
(Continued)

*Primary Examiner* — Mounir S Amer
(74) *Attorney, Agent, or Firm* — CROWE & DUNLEVY LLC

(57) ABSTRACT

An in-memory computation (IMC) system includes an in-memory computation circuit formed by a first phase change memory (PCM) array configured to store the computational weights for an in-memory computation operation. A data storage circuit is formed by a second PCM array configured to store backup data for the computational weights for the in-memory computation operation. The first PCM array includes PCM cells made of a phase change material provided by a first GST alloy, and the second PCM array includes PCM cells made of a phase change material provided by a second GST alloy different from the first GST alloy. A control circuit operates to read the backup data from the second PCM array and write to the first PCM array to refresh the computational weights for the in-memory computation operation from the backup data.

16 Claims, 18 Drawing Sheets

(51) Int. Cl.
*H10B 63/00* (2023.01)
*H10N 70/00* (2023.01)

(52) U.S. Cl.
CPC ......... *G11C 13/0069* (2013.01); *H10B 63/30* (2023.02); *H10N 70/021* (2023.02); *H10N 70/063* (2023.02); *H10N 70/066* (2023.02); *H10N 70/8828* (2023.02); *G11C 2213/79* (2013.01)

(56) References Cited

U.S. PATENT DOCUMENTS

| | | | | |
|---|---|---|---|---|
| 11,380,843 | B2 | 7/2022 | Shen et al. | |
| 2013/0181183 | A1 | 7/2013 | Pellizzer et al. | |
| 2018/0047784 | A1* | 2/2018 | Ohba | H10B 63/24 |
| 2018/0277601 | A1* | 9/2018 | Ahn | H10B 63/80 |
| 2020/0052199 | A1 | 2/2020 | Cappelleti et al. | |
| 2021/0004174 | A1 | 1/2021 | Boniardi et al. | |
| 2021/0073623 | A1 | 3/2021 | Yudanov et al. | |
| 2021/0305502 | A1* | 9/2021 | Berthelon | H10N 70/021 |
| 2022/0044099 | A1 | 2/2022 | Conte et al. | |
| 2023/0005534 | A1 | 1/2023 | Pan | |
| 2023/0161557 | A1 | 5/2023 | Zhao et al. | |
| 2023/0229922 | A1 | 7/2023 | Sun et al. | |

OTHER PUBLICATIONS

Varshika, M. Lakshmi, et al.: “Nonvolatile Memories in Spiking Neural Network Architectures: Current and Emerging Trends,” MDPI, Electronics 2022, 11, 1610, 24 pgs.
EP Search Report and Written Opinion for counterpart EP Appl. No. 24190606.4, report dated Nov. 21, 2024, 11 pgs.
Munoz-Martin, Irene, et al.: “A Drift-Resilient Hardware Implementation of Neural Accelerators Based on Phase Change Memory Devices,” IEEE Transactions on Electron Devices, vol. 68, No. 12, Dec. 2021, 6 pgs.

* cited by examiner

PROCESS FOR COINTEGRATION OF TWO PHASE CHANGE MEMORY (PCM) ARRAYS HAVING DIFFERENT PHASE CHANGE MATERIALS, AND IN-MEMORY COMPUTATION SYSTEM UTILIZING THE TWO PCM ARRAYS

TECHNICAL FIELD

The present disclosure generally relates to an in-memory computation (IMC) system utilizing first and second phase change memory (PCM) arrays, where the first PCM array performs the in-memory computation using stored computational weight data and the second PCM array stores backup data used to refresh the computational weight data in the first PCM array. In addition, the present disclosure relates to a method for cointegrating the first and second PCM arrays with different phase change materials on a common integrated circuit substrate.

BACKGROUND

An in-memory computation (IMC) system stores information in the bit cells of a memory array and performs calculations at the bit cell level. An example of a calculation performed by an IMC system is a multiply and accumulate (MAC) operation where an input array of numbers (X values, also referred to as the feature or coefficient data) are multiplied by an array of computational weights (g values) stored in the memory and the products are added together to produce an output array of numbers (Y values, also referred to as the decision data).

$$\begin{bmatrix} Y_1 \\ Y_2 \\ \vdots \\ Y_m \end{bmatrix} = \begin{bmatrix} g_{11} & g_{12} & \cdots & g_{1n} \\ g_{21} & g_{22} & \cdots & g_{2n} \\ \vdots & \vdots & \vdots & \vdots \\ g_{m1} & g_{m2} & \cdots & g_{mn} \end{bmatrix} \times \begin{bmatrix} X_1 \\ X_2 \\ \vdots \\ X_n \end{bmatrix}$$

$$\begin{cases} Y_1 = g_{11} \times X_1 + g_{12} \times X_2 + \ldots + g_{1n} \times X_n \\ Y_2 = g_{21} \times X_1 + g_{22} \times X_2 + \ldots + g_{2n} \times X_n \\ \vdots \\ Y_m = g_{m1} \times X_1 + g_{m2} \times X_2 + \ldots + g_{mn} \times X_n \end{cases}$$

By performing these calculations at the bit cell level in the memory, the IMC system does not need to move data back and forth between a memory device and a computing device. Thus, the limitations associated with data transfer bandwidth between devices are obviated and the computation can be performed with lower power consumption.

It is known in the art for the memory array of the IMC system to be implemented using phase change memory (PCM) cells. A PCM cell is configured to store the weight data using a phase change material that is capable of stably transitioning between amorphous and crystalline phases according to an amount of heat transferred thereto. The amorphous and crystalline phases exhibit two or more distinct resistances, in other words two or more distinct transconductances, which are used to distinguish two (for binary data) or more (for m-ary data, m being an integer greater than or equal to three) distinct logic states programmable into the memory cell. The amorphous phase exhibits a relatively higher resistance (i.e., a lower transconductance) and thus the current flowing through the memory cell programmed in this state when selected is relatively smaller. Conversely, the crystalline phase exhibits a relatively lower resistance and thus the current flowing through the memory cell programmed in this state is relatively larger.

The phase change material used in a PCM cell typically utilizes germanium (Ge) along with chemical elements of Group VI of the Periodic Table of the Elements such as tellurium (Te), selenium (Se), and/or antimony (Sb) which are referred to in the art as chalcogenides or chalcogenic materials. For example, the phase change material may comprise a $Ge_xSb_yTe_z$ alloy (referred to in the art as a GST alloy).

Memories that utilize phase change memory elements formed from certain widely used GST alloys are known to suffer from some reliability issues. In particular, there is evidence that certain stoichiometric GST alloys (such as the GST 225 alloy ($Ge_2Sb_2Te_5$) and the GST 447 alloy ($Ge_4Sb_4Te_7$)) exhibit a concern with phase retention (used to identify one or more logic states for the stored data) at high temperature. As a result, there may be a loss of logic state for the stored data. To compensate for this loss, it is necessary to refresh the stored data in the memory array.

SUMMARY

In an embodiment, a method for cointegrated fabrication, on a common semiconductor substrate having a first area and a second area, of a first phase change memory (PCM) cell and a second PCM cell, comprises: forming a heating element within an insulating region over both the first area of the common semiconductor substrate and the second area of the common semiconductor substrate; depositing a layer of a first phase change material over the heating elements for both the first area and the second area; masking over the layer of the first phase change material at the second area and removing the layer of the first phase change material at the first area; depositing a layer of a second phase change material, different from the first phase change material, over the heating element for the first area and over the layer of the first phase change material at the second area; and masking over the layer of the second phase change material at the first area and removing the layer of the second phase change material at the second area.

In an embodiment, a method for cointegrated fabrication, on a common semiconductor substrate having a first area and a second area, of a first phase change memory (PCM) cell and a second PCM cell, comprises: depositing a layer of a first phase change material over a first insulated heating element associated with the first area; depositing a layer of a second phase change material, different from the first phase change material, over a second insulated heating element associated with the second area; lithographically patterning the layer of the first phase change material to define a first memory region for the first PCM cell; and lithographically patterning the layer of the second phase change material to define a second memory region for the second PCM cell.

In an embodiment, an in-memory computation (IMC) system comprises: an in-memory computation circuit including a first phase change memory (PCM) array configured to store the computational weights for an in-memory computation operation; wherein the first PCM array comprises PCM cells made of a phase change material comprising a first GST alloy; a data storage circuit including a second PCM array configured to store backup data for the computational weights for the in-memory computation operation; wherein the second PCM array comprises PCM cells made of a phase change material comprising a second GST alloy different from the first GST alloy; and a control circuit configured to read the backup data from the second PCM array and write to the first PCM array to refresh the computational weights for the in-memory computation operation from said backup data.

An in-memory computation (IMC) system, comprising: an in-memory computation circuit including a first phase change memory (PCM) array configured to store the computational weights for an in-memory computation operation; wherein the first PCM array comprises PCM cells made of a phase change material comprising a first GST alloy; a data storage circuit including a second PCM array configured to store backup data for the computational weights for the in-memory computation operation; and wherein the second PCM array comprises PCM cells made of a phase change material comprising a second GST alloy different from the first GST alloy.

BRIEF DESCRIPTION OF THE DRAWINGS

For a better understanding of the embodiments, reference will now be made by way of example only to the accompanying figures in which:

FIGS. 5A-1 to 5N-1 and 5A-2 to 5N-2 shows process steps for cointegrated fabrication of two PCM arrays with memory cells using two different phase change materials.

DETAILED DESCRIPTION

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless specified otherwise, it is referred to the orientation of the drawings.

Figure 1:
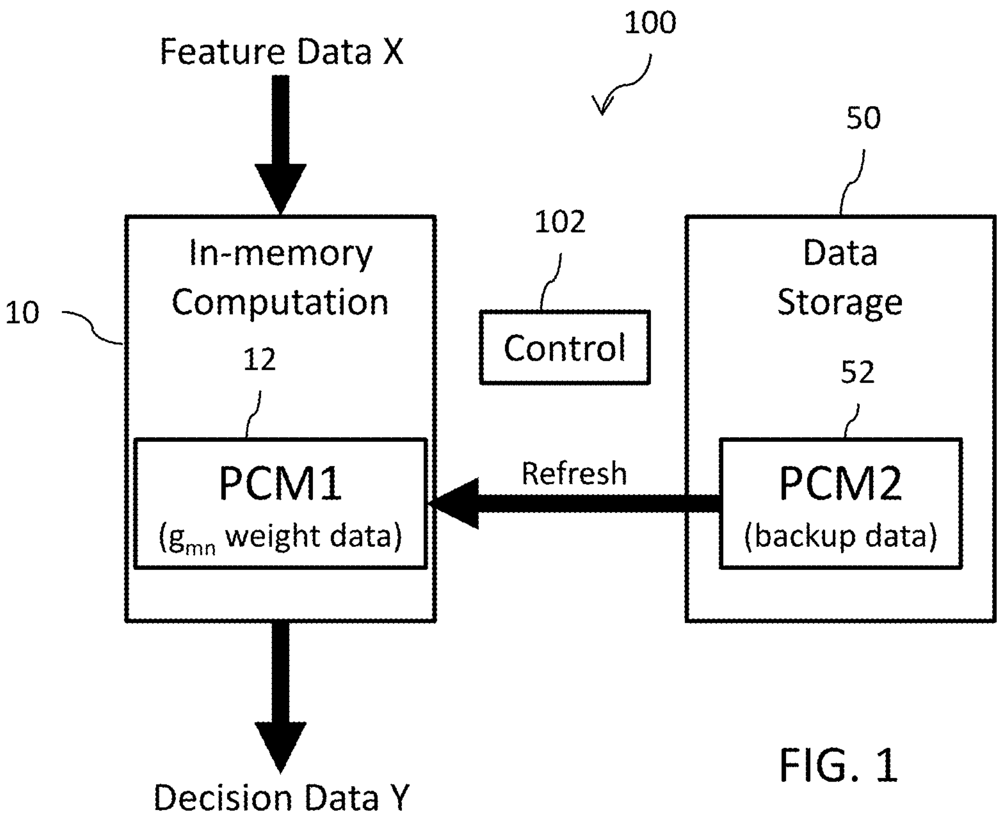
FIG. 1 is a block diagram of an in-memory computation (IMC) system.

Reference is now made to FIG. 1 which shows a block diagram of an in-memory computation (IMC) system 100. The system 100 includes an in-memory computation circuit 10 including a first phase change memory (PCM) array (PCM1) 12 configured to store the computational weights ($g_{mn}$ weight data) for the in-memory computation operation. The in-memory computation circuit 10 receives an input array of numbers referred to as the feature (or coefficient) data X which are matrix vector multiplied (MVM) by the array of the stored computational weight data $g_{mn}$ to produce an output array of numbers referred to as the decision data Y.

The PCM cells within the PCM1 array 12 utilize a first GST alloy for the phase change material. This first GST alloy is selected for its suitability to support implementation of a rheostatic memory cell. By this it is meant that the PCM cells within the PCM1 array 12 are capable of storing m-ary (where m is an integer greater than or equal to three) logic states. In other words, the amorphous and crystalline phases of the phase change material of each PCM cell in the PCM1 array 12 can be programmed to exhibit three or more distinct resistances with a corresponding three or more distinct transconductances. A concern with implementing the PCM cells within the PCM1 array 12 using the first GST alloy for the phase change material is that this phase change material exhibits a data retention concern at high temperature. Exposure to high temperate can produce a loss of logic state associated with one or more of the distinct resistances associated with the stored m-ary logic states.

In a preferred implementation, the first GST alloy is a stoichiometric GST alloy such as the GST 225 alloy ($Ge_2Sb_2Te_5$) or the GST 447 alloy ($Ge_4Sb_4Te_7$). In this context, a "stoichiometric GST alloy" is understood by those skilled in the art to be stable in both the crystalline and amorphous phases (i.e., same composition in the two phases). This is contrasted to non-stoichiometric GST alloys, such as with Ge-rich alloys, that cannot maintain the same chemical composition in both the crystalline and amorphous phases. The excess Ge that can be incorporated into the amorphous phase compared to the stoichiometric compositions must be expelled to allow for lattice formation. Thus, during the phase transition the material tends to segregate into pure Ge and stoichiometric GST.

The system 100 further includes a data storage circuit 50 including a second phase change memory (PCM) array (PCM2) 52 configured to store a backup of the computational weights ($g_{mn}$ weight data) for the in-memory computation operation.

The PCM cells within the PCM2 array 52 utilize a second GST alloy, different from the first GST alloy, for the phase change material. This second GST alloy is selected for its suitability to provide stability in phase retention over a wide range of temperature (i.e., it is thermally stable).

In a preferred implementation, the second GST alloy is a germanium rich GST alloy. In this context, a Ge-rich GST alloy is an alloy where germanium is a predominant component of the average composition for the alloy. In other words, the stoichiometric percentage of germanium in the Ge-rich GST alloy is greater than 50%. An advantage of Ge-rich GST alloys is an increase in crystallization temperature, providing an increased ability to preserve the stored logic state (phase retention), without degrading cycling performance. Examples of Ge-rich GST alloys suitable for use as the phase change material for the PCM cells within the PCM2 array 52 include: the GST 712 alloy ($Ge_7Sb_1Te_2$) and the GST 523 alloy ($Ge_5Sb_2Te_3$). Alternatively, a Ge-rich GST alloy including nitrogen may be used such as $Ge_xSb_yTe_zN_j$ where the stoichiometric percentage of germanium is greater than or equal to 50%, for example, at or about 70%, and the stoichiometric percentage of nitrogen is in a range of 5-25% (more preferably between 8-21%, still more preferably between 11-18%, and even more preferably between 13-15%).

The system 100 still further includes a control circuit 102 that operates to read the backup of the computational weights ($g_{mn}$ weight data) stored in the PCM2 array 52 of the data storage circuit 50 and then write that data into the PCM1 array 12 in-memory computation circuit 10 (see, refresh arrow). The effect of this read-write operation is to refresh the computational weights for the in-memory computation operation and thus obviate concerns with respect to data retention of the PCM cells within the PCM1 array 12 which utilize the first GST alloy for the phase change material.

In a preferred implementation with use of a Ge-rich GST alloy for the PCM2 array 52, it is noted the PCM cells will stably store binary logic states for the data. Because the PCM1 array 12 is configured to store m-ary logic states in each PCM cell, the PCM2 array 52 is accordingly designed to be larger in size than the PCM1 array 12 in order to support backup all of the computational weight data. Consider an example were each PCM cell within the PCM1 array 12 can store distinct four logic states (i.e., the PCM cell is a 4-ary (quaternary) cell). Backup storage of the 4-ary logic states of each PCM cell of the PCM1 array 12 is supported through the use of two PCM cells of the PCM2 array 52. The controller 102 advantageously performs a conversion of the multiple bits of binary data stored in multiple PCM cells of the PCM2 array 52 to write one bit of m-ary data to one PCM cell of the PCM1 array 12.

Figure 2:
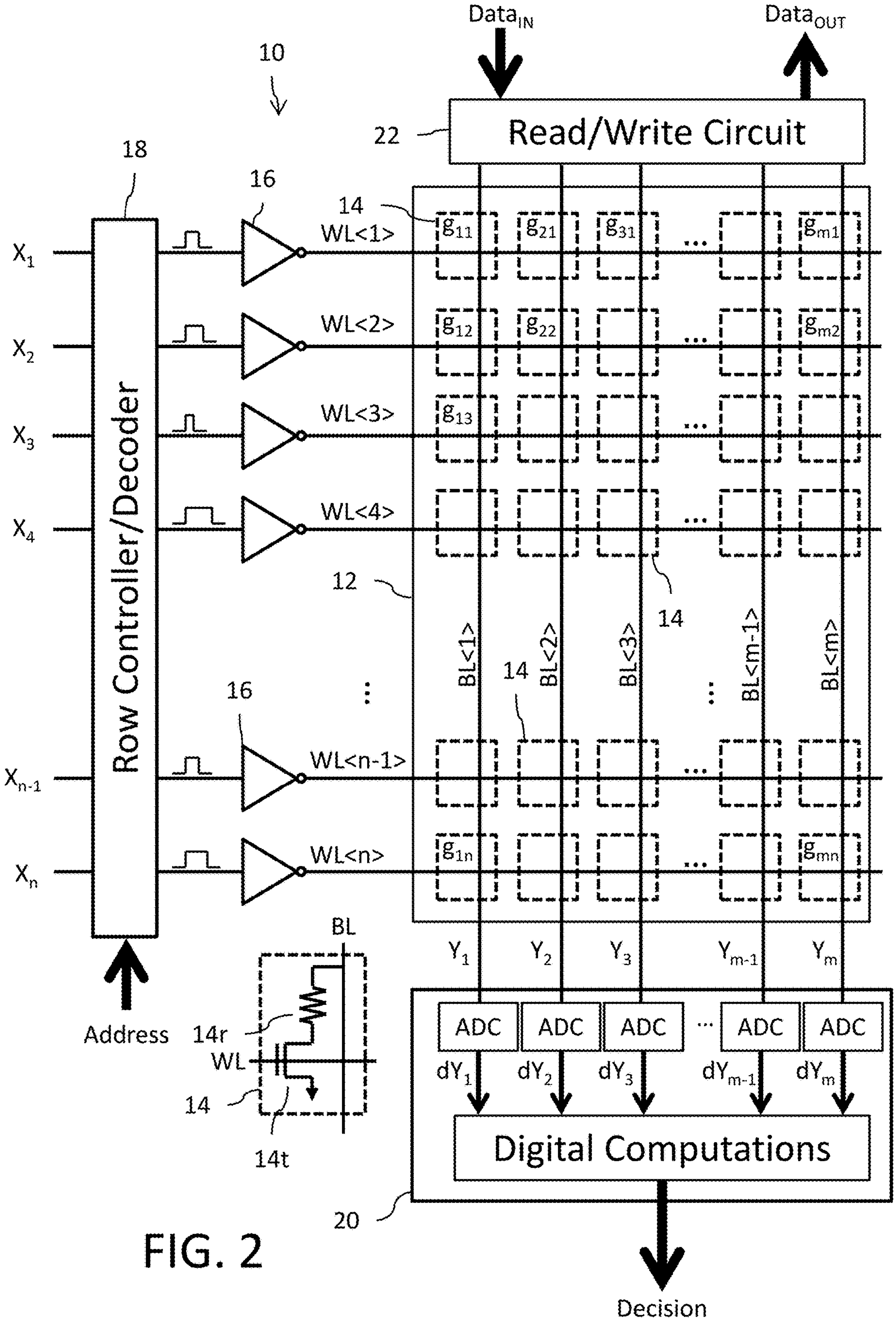
FIG. 2 is a schematic diagram of an embodiment for an in-memory computation circuit of the IMC system in FIG. 1.

Reference is made to FIG. 2 which shows a schematic diagram of the in-memory computation circuit 10 of FIG. 1. The circuit 10 utilizes a memory array (PCM1) 12 formed by a plurality of memory cells 14 arranged in a matrix format having m columns and n rows. Each memory cell 14 is programmed to store a bit of data $g_{ab}$, where a is an integer from 1 to m and b is an integer from 1 to n, relating to the computational weights (also referred to as kernel data) for an in-memory compute operation. Each bit of the computational weight has an m-ary logic value (where m is an integer greater than or equal to three) which is represented, for example, by a programmable transconductance in the memory cell 14.

In an embodiment of the memory array 12, each memory cell 14 comprises a phase change memory (PCM) cell formed by a select circuit (MOSFET transistor) **14*t* operating as a switching element and a variable resistive element 14*r* providing a programmable transconductance. The control node (gate) of the MOSFET transistor select circuit 14*t* is connected to the word line WL. The source-drain conduction path of the MOSFET transistor switching element 14*t* is connected in series with the variable resistive element 14*r*** between the bit line BL and a reference node (for example, a source line or ground).

The PCM-type memory cell 14 is a rheostatic cell configured to store the weight data using a phase change material. The phase change material is a chalcogenide in the form of a first GST alloy such as a stoichiometric GST alloy such as, for example, the GST 225 alloy ($Ge_2Sb_2Te_5$) or the GST 447 alloy ($Ge_4Sb_4Te_7$).

Each memory cell 14 includes a word line WL and a bit line BL. The memory cells 14 in a common row of the matrix are connected to each other through a common word line WL<b>. The memory cells 14 in a common column of the matrix are connected to each other through a common bit line BL<a>.

Each word line WL<b> is driven by a word line driver circuit 16 with a pulsed word line signal generated by a row controller/decoder circuit 18. The word line driver circuit 16 may be implemented as a CMOS driver circuit (for example, a series connected p-channel and n-channel MOSFET transistor pair forming a logic inverter circuit).

The row controller/decoder circuit 18 receives an address signal (Address) for the in-memory compute operation and in response thereto performs the function of selecting which plural ones of the word lines WL<1> to WL<n> are to be simultaneously accessed (or actuated) in parallel during an analog in-memory compute operation. The row controller/decoder circuit 18 further receives the feature or coefficient data $X_b$ for the in-memory compute operation and in response thereto controls, for each corresponding actuated word line WL<b>, the width (i.e., the on time $T_{ON}$) of the generated pulsed word line signal. This functionality is a form of a pulse width modulation (PWM) control for the applied word line signals dependent on the digital value of the received feature or coefficient data X.

FIG. 2 illustrates, by way of example only, the simultaneous actuation of all word lines WL<1>, . . . , WL<n> in response to the received Address with pulsed word line signals having pulse widths set by the digital value of the corresponding coefficient data $X_1, \ldots, X_n$. It will, of course, be understood that the in-memory compute operation may instead utilize a simultaneous actuation of fewer than all rows of the memory array (through either Address signal selection or through a zero value for a given coefficient data $X_b$).

The analog signal $Y_a$ developed on the bit line BL<a> is dependent on the logic state of the bits of the computational weight $g_{ab}$ stored in the b=1 to n memory cells 14 of the column and the widths of the pulsed word line signals applied to the word lines WL<1>, . . . , WL<n> for those memory cells 14. More specifically, it will be understood that each memory cell 14 contributes a bit line BL discharge current that is proportional to $X_b \times g_{ab}$. So, in the example shown in FIG. 1 where the word line signals 16 are simultaneously applied to the word lines WL<1>, . . . , WL<n>, the analog signal $Y_1$ developed on the bit line BL<1> is proportional to the sum of discharge currents due to $X_1 \times g_{11}$, $X_2 \times g_{12}$, . . . , and $X_n \times g_1$.

A column processing circuit 20 senses and samples the analog signal $Y_a$ on each bit line BL<a> for the m columns and converts the analog signal to a corresponding digital signal $dY_a$ using analog-to-digital converter circuitry. Although FIG. 2 illustrates that one analog-to-digital converter (ADC) is provided for each column, it will be understood that ADC resources in the column processing circuit 20 could instead be shared by multiple columns using time division multiplexing. The column processing circuit 20 may further include digital signal processing circuitry for performing digital computations and calculations on the digital signals $dY_a$ to generate a decision output for the in-memory compute operation.

The circuit 10 further includes a read-write circuit 22 that operates in conjunction with the row controller/decoder circuit 18 in connection with memory access operations to write bits of data (for example, the computational weight data) to, and read bits of data from, the memory cells 14 of the memory array 12 according to the applied Address. This operation is referred to as a conventional memory access mode and is distinguished from the analog in-memory compute operation discussed above. Operation in the conventional memory access mode to write data into the memory cells 14 of the memory array 12 is performed in connection with performing the data refresh using the backup of the computational weights ($g_{mn}$ weight data) stored in the PCM2 array 52 of the data storage circuit 50.

The control circuit 102 would then control the read-write circuit 22 and the Address selection to perform the data write operation.

The configuration of the in-memory computation circuit 10 shown in FIG. 2 is just one example of an in-memory computation circuit suitable for use in the IMC system 100 of FIG. 1. The FIG. 2 example for the in-memory computation circuit 10 is to be understood as a non-limiting example. Those skilled in the art are well-aware of other configurations for in-memory computation circuits that could instead be used for the IMC system 100. What is important to note, no matter what in-memory computation circuit configuration is employed, is that the memory cells 14 of the memory array 12 are implemented as rheostatic memory cells using a stoichiometric GST alloy discussed above for the phase change material.

Figure 3:
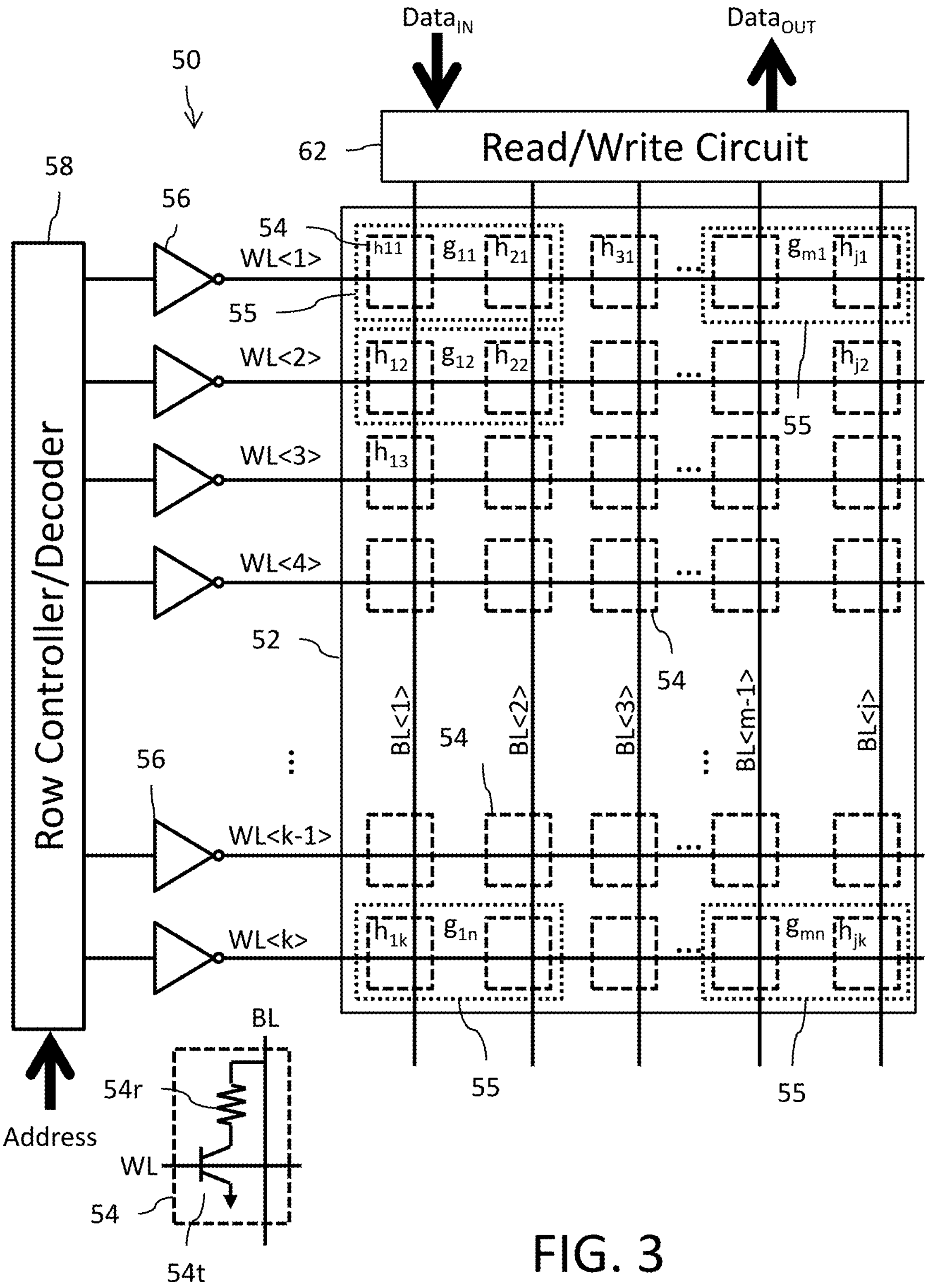
FIG. 3 is a schematic diagram of an embodiment for a backup data storage circuit of the IMC system in FIG. 1.

Reference is made to FIG. 3 which shows a schematic diagram of the data storage circuit 50 of FIG. 1. The circuit 50 utilizes a memory array 52 formed by a plurality of memory cells 54 arranged in a matrix format having j columns and k rows. Each memory cell 54 is programmed to store a bit of backup data $h_{cd}$, where c is an integer from 1 to j and d is an integer from 1 to k, relating to the computational weights (also referred to as kernel data) for the in-memory compute operation. Each bit of the backup data has a binary logic value which is represented, for example, by a programmable transconductance in the memory cell 54.

Each m-ary bit of data $g_{ab}$ for the computational weight is associated with a plurality of binary bits of backup data $h_{cd}$. This is because it takes multiple binary data bits of backup data $h_{cd}$ to store the equivalent logic state of one m-ary computational weight bit of data $g_{ab}$. In a particular example where m=4, a single bit of computational weight data $g_{ab}$ is associated with two bits of backup data $h_{cd}$. This relationship is illustrated in FIG. 3 by the dotted box 55 which surrounds two memory cells 54. For example, the m-ary computational weight data $g_{11}$ is associated with the binary backup data bits $h_{11}$ and $h_{21}$, while the m-ary computational weight data $g_{12}$ is associated with the binary backup data bits $h_{12}$ and $h_{22}$.

In an embodiment of the memory array 52, each memory cell 54 comprises a phase change memory (PCM) cell formed by a select circuit (bipolar transistor) **54*t* operating as a switching element and a variable resistive element 54*r* providing a programmable transconductance. The control node (base) of the bipolar transistor select circuit 54*t* is connected to the word line WL. The emitter-collector conduction path of the bipolar transistor switching element 54*t* is connected in series with the variable resistive element 54*r* between the bit line BL and a reference node (for example, a source line or ground). The use of a bipolar transistor for the select circuit 54*t* is preferred here for the memory cell 54 because it occupies less space than a corresponding MOS transistor and thus supports a higher density with a more compact cell. However, it will be understood that a MOS transistor could instead be used for the select circuit 54*t* in applications where density of the memory array 52** is of less concern.

The PCM-type memory cell 54 is configured to store the backup weight data using a phase change material. The phase change material is a chalcogenide in the form of a second GST alloy, different from the first GST alloy used in array 12, such as a Ge-rich GST alloy (i.e., an alloy where germanium is a predominant component of the average composition—for example, where the stoichiometric percentage of germanium in the GST alloy is greater than or equal to 50%). Examples of suitable germanium rich GST alloys are identified above. It will be noted that the PCM-type memory cell 54 is not a rheostatic cell.

Each memory cell 54 includes a word line WL and a bit line BL. The memory cells 54 in a common row of the matrix are connected to each other through a common word line WL<c>. The memory cells 54 in a common column of the matrix are connected to each other through a common bit line BL<d>.

Each word line WL<d> is driven by a word line driver circuit 56 with a pulsed word line signal generated by a row controller/decoder circuit 58. The word line driver circuit 56 may be implemented as a CMOS driver circuit (for example, a series connected p-channel and n-channel MOSFET transistor pair forming a logic inverter circuit).

The row controller/decoder circuit 58 receives an address signal (Address) for the memory access mode of operation and in response thereto performs the function of selecting a single one of the word lines WL<1> to WL<j> to be accessed (or actuated) when performing a read to or write from the memory array.

A read-write circuit 62 operates in conjunction with the row controller/decoder circuit 58 in connection with memory access operations to write bits of data (for example, the computational weight data) to, and read bits of data from, the memory cells 54 of the memory array 52. This operation is referred to as a conventional memory access mode. Operation in the conventional memory access mode to read data from the memory cells 54 of the memory array 52 is performed in connection with the data refresh using the bits of backup data $h_{jk}$ read from memory array 52 to generate the computational weights ($g_{mn}$ weight data) for storage in (i.e., write to) the memory cells 14 of the memory array 12. As previously discussed, the control circuit 102 operates to control the read from memory 52 through the read-write circuit 62 and the applied Address, the conversion of the bits of backup data $h_{jk}$ from binary to m-ary, and the write to memory 12 of the m-ary computational weight data $g_{mn}$ to the memory array 12 through the read-write circuit 22 and its applied Address.

Figure 4:
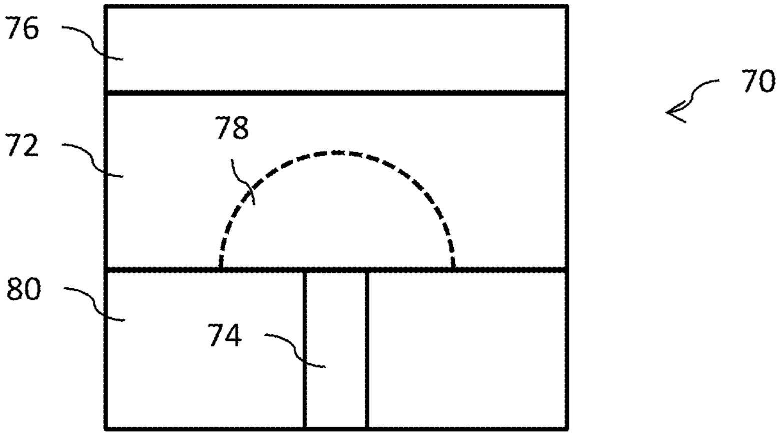
FIG. 4 shows a cross-section of a phase change memory (PCM) cell.

Reference is now made to FIG. 4 which shows a cross-section of a phase change memory cell 70. The memory cell 70 includes a memory region 72. A first electrode 74 is in contact with a lower surface of the memory region 72. A second electrode 76 is in contact with an upper surface of the memory region 72. The memory region is made of a phase change material, for example, a chalcogenic material comprising a GST alloy. Where the memory cell 70 forms one of the memory cells 14 of the memory array 12 in the in-memory computation circuit 10 of FIGS. 1 and 2, the cell 70 is a rheostaic cell using a GST alloy for the memory region 72 that is a stoichiometric GST alloy, for example, comprising the GST 225 alloy ($Ge_2Sb_2Te_5$) or the GST 447 alloy ($Ge_4Sb_4Te_7$). Where the memory cell 70 forms one of the memory cells 54 of the memory array 52 in the data storage circuit 50 of FIGS. 1 and 3, the GST alloy used for the memory region 72 is the Ge-rich GST alloy (where the germanium content by weight in the alloy equals or exceeds 50%). The first and second electrodes 74 and 76 are made of an electrically conductive material (such as TiSiN, TiN or TaN). In the case of the rheostatic cell configuration for memory cells 14 of the memory array 12, an additional conductive (resistive) layer (not explicitly shown in FIG. 4, but see layer 228 described in more detail herein) is provided between the first electrode 74 and the memory region 72. The first electrode 74 is configured with a very narrow width relative to the second electrode 76. This provides for a smaller thermal conduction area at the lower surface of the memory region 72. The first electrode 74 is surrounded by an insulating material 80 and electrically coupled to a select circuit (transistor) that is not shown in FIG. 4, but reference may be made, for example, to transistor 14*t* in FIG. 2 or transistor 54*t* in FIG. 3, that controls the passage of an electric current through the first electrode 74. This electric current, by the Joule effect, selectively heats the chalcogenic material in the memory region 72. The first electrode 74 accordingly functions as a heating element. Through the thermal conduction area at the lower surface of the memory region 72, the heating is focused to effectuate a phase change in a semicircular or hemispherical portion 78 of the memory region 72.

To program a logic state in the memory cell 70, the heating element provided by the first electrode 74 is actuated to heat the phase change portion 78 of the memory region 72 above its crystallization temperature. Control is then exercised over the rate at which the phase change portion 78 is subsequently allowed to cool. With a slower cooling rate, the phase change material in the phase change portion 78 will tend towards a crystalline phase. Conversely, with a faster cooling rate, the phase change material in the phase change portion 78 will tend towards an amorphous phase.

In a binary data storage function, such as implemented in connection with the memory array 52 of the data storage circuit 50 and use of the germanium rich GST alloy, the resistance of the memory region 72 with the phase change portion 78 programmed in the crystalline phase provides a first logic state (referred to as the reset state or logic "0" state), and the resistance of the memory region 72 with the phase change portion 78 programmed in the amorphous phase provides a second logic state (referred to as the set state or logic "1" state). When reading from the memory cell 70, a voltage is applied between the first and second electrodes 74, 76 and the current that flows through the memory region 72 is read. The current will have a magnitude that is proportional to the conductivity of the memory region 72. A relatively higher current—due lower resistance—will flow with the phase change portion 78 programmed in the crystalline phase, thus indicating a programming of the memory cell 70 in the reset state or logic "0" state, and a relatively lower current—due to higher resistance—will flow with the phase change portion 78 programmed in the amorphous phase, thus indicating a programming of the memory cell 70 in the set state or logic "1" state.

In an m-ary data storage function, such as implemented in connection with the memory array 12 of the in-memory computation circuit 10 and the use of the rheostatic cell configuration with a stoichiometric GST alloy, the resistance of the memory region 72 with the phase change portion 78 programmed in the crystalline phase provides a first logic state, the different resistances of the memory region 72 due to differing volumes of the phase change portion 78 in the amorphous phase provide intermediate logic states and a last logic state. Consider now the example where m=4 (i.e., the 4-ary or quaternary logic). When reading from the memory cell 70, a voltage is applied between the first and second electrodes 74, 76 and the current that flows through the memory region 72 is read. The current will have a magnitude that is proportional to the conductivity of the memory region 72. The magnitude of the current—as a function of the resistance—is sensed. A highest current—due to lowest resistance—will flow with the phase change portion 78 programmed in the crystalline phase, thus indicating a programming of the memory cell 70 in a first logic "11" state. A slightly lower current—due to a slightly higher resistance—will flow with the phase change portion 78 programmed in an amorphous phase having a first volume, thus indicating a programming of the memory cell 70 in a second logic "10" state. A further lower current—due to a higher resistance—will flow with the phase change portion 78 programmed in an amorphous phase having a second volume (greater than the first volume), thus indicating a programming of the memory cell 70 in a third logic "01" state. Lastly, a lowest current—due to highest resistance—will flow with the phase change portion 78 programmed in an amorphous phase having a third volume (greater than the second volume), thus indicating a programming of the memory cell 70 in a fourth logic "00" state.

With reference once again to FIG. 1, to ensure a wide range of application for the in-memory computation (IMC) system 100, and in particular to support real edge computation applications in harsh environmental conditions, a single integrated circuit chip implementation for the system 100 is preferred. Thus, the in-memory computation circuit 10, the data storage circuit 50 and the control circuit 102 are preferably supported on a single integrated circuit substrate. This is referred to in the art as a System-on-Chip (SoC) solution. The challenge then becomes how to cointegrate the memory array 12 including PCM cells 14 using a rheostatic cell configuration with a stoichiometric chalcogenide material such as provided by the GST 225 alloy ($Ge_2Sb_2Te_5$) or the GST 447 alloy ($Ge_4Sb_4Te_7$)—the first GST alloy for memory PCM1—with the memory array 52 including PCM cells 54 using the germanium rich chalcogenide material provided by the Ge-rich GST alloy—the second GST alloy for memory PCM2.

Reference is now made to FIGS. 5A-1 to 5N-1 and 5A-2 to 5N-2 which illustrate steps in a fabrication method for cointegration of a PCM cell 14 using a rheostatic cell configuration with the chalcogenide phase change material provided by a first GST alloy (for example, using a stoichiometric alloy such as the GST 225 alloy ($Ge_2Sb_2Te_5$) or the GST 447 alloy ($Ge_4Sb_4Te_7$)) with a PCM cell 54 using the chalcogenide phase change material provided by a second GST alloy that is different from the first GST alloy (such as, for example, the Ge-rich GST alloy). In these figures, the use of the "−1" suffix for the figure label indicates that the illustrated structure is associated with the PCM cell 14. With respect to figures using the "−1" suffix, the structure illustrated on the right side shows a cross section taken through the dotted vertical line 200 shown in the left side. Thus, the structure shown in the left side of the "−1" suffix figures extends in a first direction (for example, an x-direction) and the structure shown in the right side of the "−1" suffix figures extends in a second direction (for example, a y-direction) orthogonal to the first direction. Furthermore, in these figures, the use of the "−2" suffix for the figure label indicates that the illustrated structure is associated with the PCM cell 54. With respect to figures using the "−2" suffix, the structure illustrated on the left side shows a cross section taken through the dotted vertical line 202 shown in the right side. Thus, the structure shown in the left side of the "−2" suffix figures extends in the first (x) direction and the structure shown in the right side of the "−2" suffix figures extends in the second (y) direction orthogonal to the first direction.

In all of the FIGS. 5A-1 to 5N-1 and 5A-2 to 5N-2, the illustrated structures preferably share a common semiconductor substrate 204 consistent with cointegration processing. In this context, the phrase "common semiconductor substrate" means a single semiconductor substrate (of bulk substrate type or semiconductor on insulator (SOI) substrate type) which supports both of the arrays 12 and 52 along with other integrated circuitry as needed for the given application.

Figures 1, 5A:
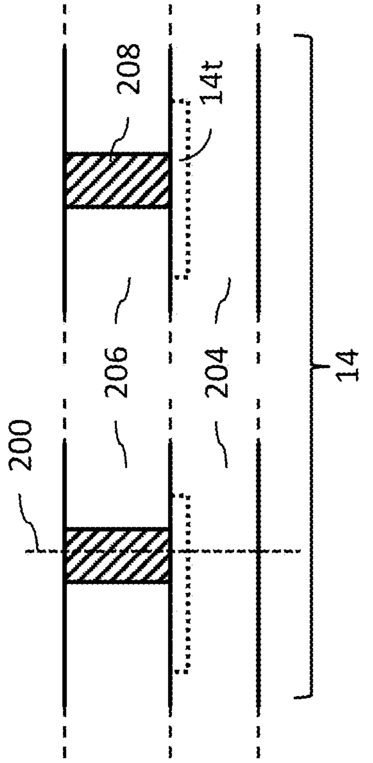
Figures 2, 5A:
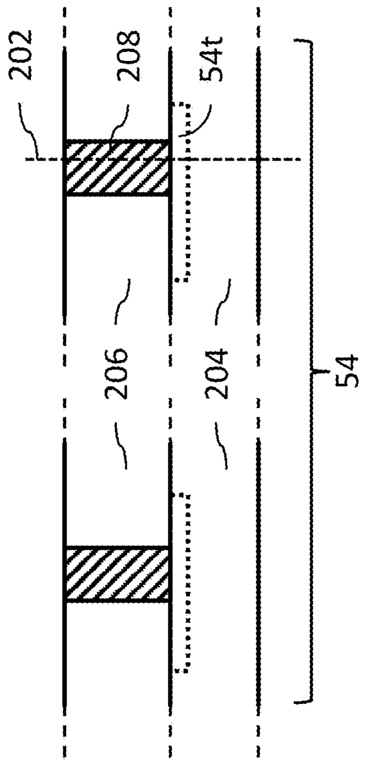

FIGS. 5A-1 and 5A-2—conventional integrated circuit fabrication processes are used to form integrated circuit transistor devices in and on the common semiconductor substrate 204. These integrated circuit transistor devices include, as shown in FIG. 5A-1 for the PCM cell 14, the MOSFET transistor select circuit 14*t*, and further include, as shown in FIG. 5A-2 for the PCM cell 54, the bipolar transistor select circuit 54*t*. Details of the implementation of a MOS transistor and bipolar transistor are not shown; it being well understood by those skilled in the art how to integrate transistor devices on the semiconductor substrate 204. A common premetallization dielectric (PMD) layer 206 is deposited over the semiconductor substrate 204 and the integrated circuit transistor devices for select circuit 14*t* and select circuit 54*t*. An upper surface of the PMD layer 206 is planarized using a suitable chemical-mechanical polishing (CMP) process. Openings are formed and then filled with a conductive material (such as, for example, tungsten) to provide substrate contacts 208 extending through the PMD layer 206 to reach doped substrate regions of the transistors for the select circuit 14*t* and select circuit 54*t*. A layer of silicide may be provided to improve contact resistance between the substrate contacts 208 and the doped substrate regions.

Figures 2, 5B:
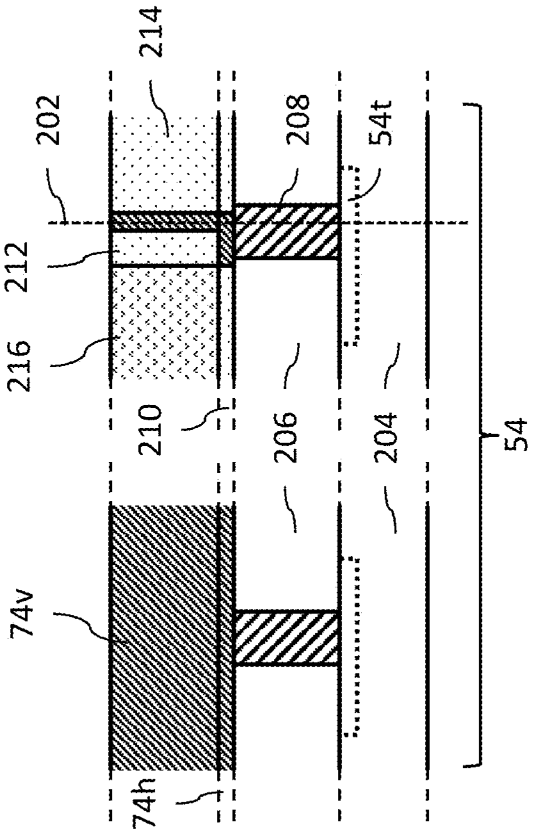
Figures 1, 5B:
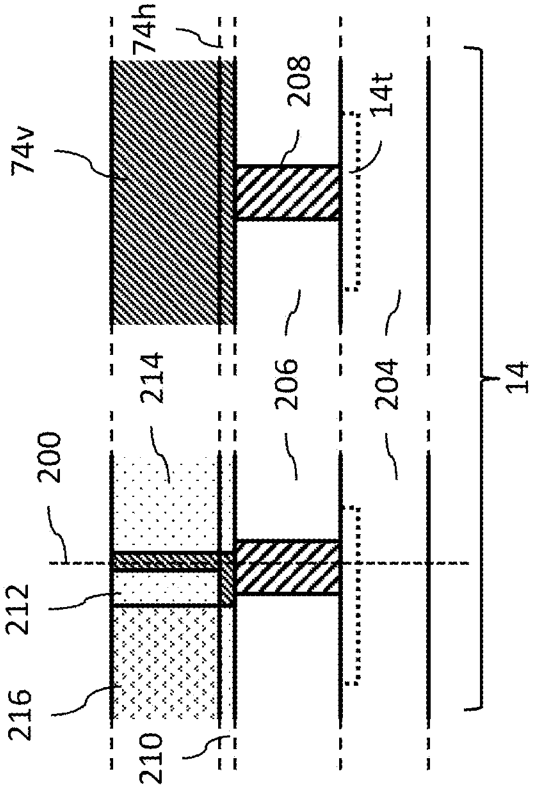

FIGS. 5B-1 and 5B-2—the heating elements 74 for the PCM cells 14 and 54 are then formed in an insulating region 80. The structure for the heating elements includes an L-shaped first electrode 74 within the insulating region 80. The provision of an L-shaped first electrode enables the vertical portion 74*v* of the first electrode 74 to occupy a smaller area at the top surface of the electrode while the horizontal portion 74*h* of the first electrode 74 occupies a larger area at the bottom surface of the electrode so as to ensure electrical contact with the substrate contact 208 in event of an alignment error during fabrication. The insulating region 80 includes a number of insulating structures including a silicon nitride layer 210 for laterally isolating the horizontal portion 74*h* of the first electrode 74, silicon nitride regions 212 and 214 surrounding the vertical portion 74*v* of the first electrode 74, and a silicon oxide region 216 insulating between heating elements of adjacent memory cells. The fabrication of the structure for the heating elements may, for example, utilize the process taught by U.S. Pat. No. 10,510,955 or 11,653,582 (both of which are incorporated herein by reference).

Figures 2, 5C:
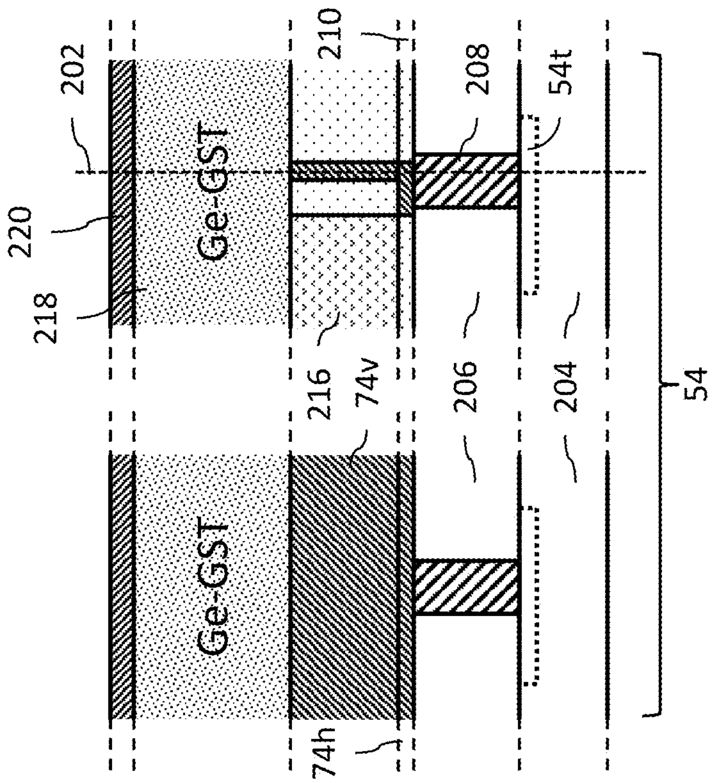
Figures 1, 5C:
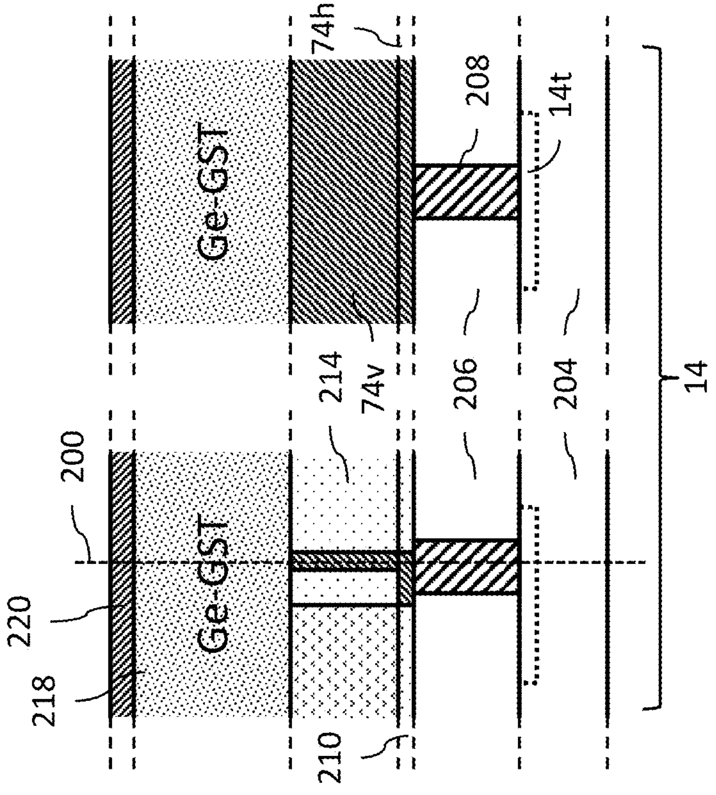

FIGS. 5C-1 and 5C-2—a layer 218 of a germanium rich (first) GST alloy (i.e., a Ge-GST alloy) is blanket deposited on top of the L-shaped first electrode 74 and regions 212, 214 and 216 of the insulating region 80. The germanium rich GST alloy may, for example, comprise a chalcogenide material provided by the GST 712 alloy ($Ge_7Sb_1Te_2$), the GST 523 alloy ($Ge_5Sb_2Te_3$), or the $Ge_xSb_yTe_zN_j$ alloy where x is a stoichiometric percentage by weight equal to or in excess of 50% and j is a stoichiometric percentage by weight as noted above. Next, a layer 220 of titanium nitride (TiN) is blanket deposited on top of the layer 218 of a germanium rich GST alloy. The layer 220 will eventually form the second electrode 76 for the memory cells 54.

Figures 2, 5D:
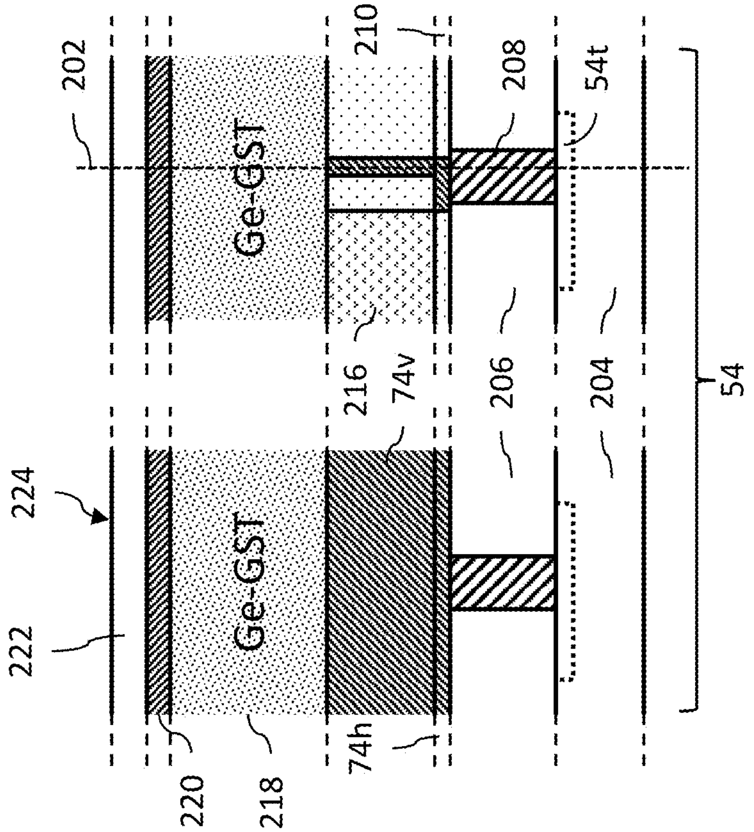
Figures 1, 5D:
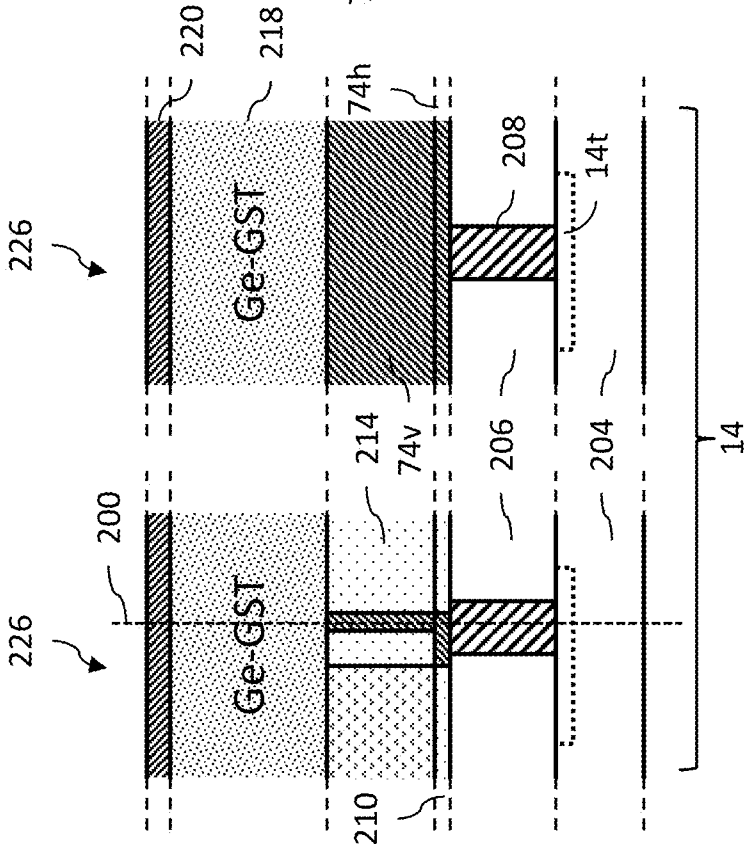

FIGS. 5D-1 and 5D-2—a masking layer 222 is then blanket deposited on top of the layer 220 and lithographically patterned to form an etch mask 224 covering the PCM cells 54. The etch mask 224 includes an opening 226 exposing the area where the PCM cells 14 are located.

Figures 2, 5E:
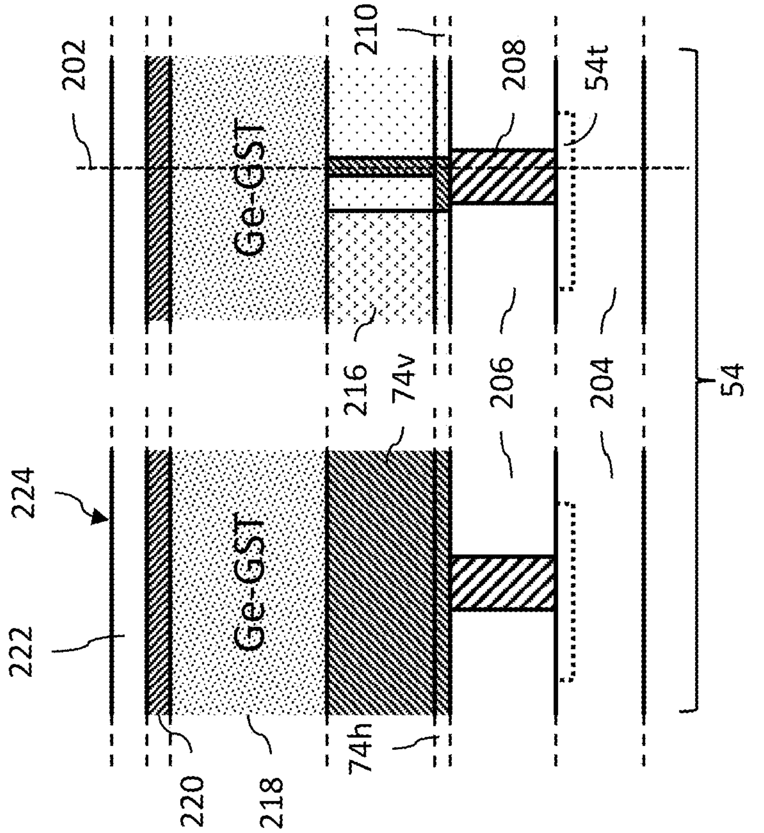
Figures 1, 5E:
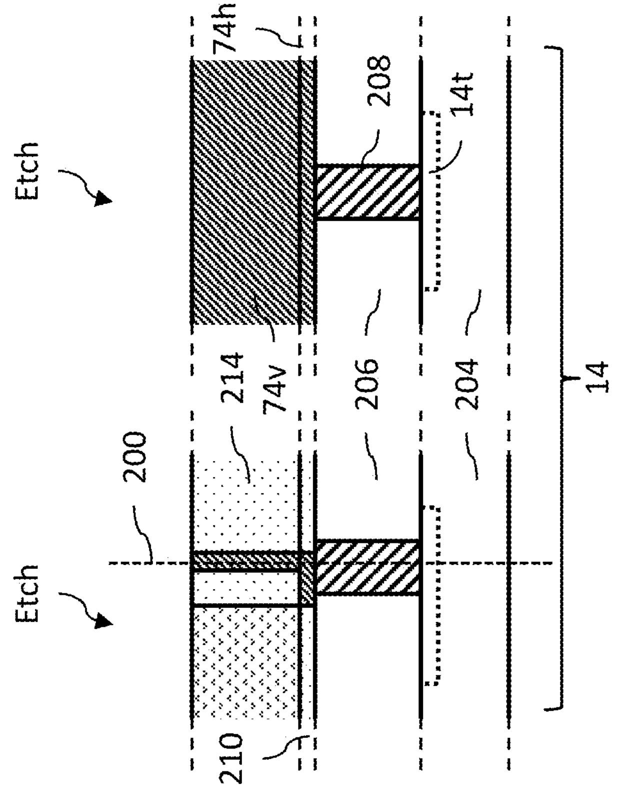

FIGS. 5E-1 and 5E-2—one or more etching operations are then performed through the opening 226 in the etch mask 224 to remove the layer 220 of titanium nitride and the layer 218 of the germanium rich GST alloy from the area where the PCM cells 14 are located. The etching operation stops when silicon nitride material from the regions 212 and 214 is reached.

Figures 1, 5F:
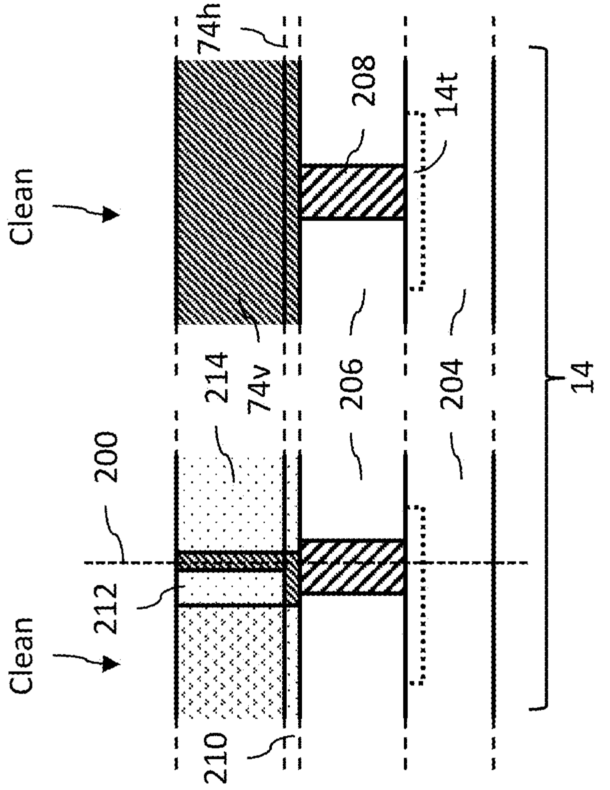
Figures 2, 5F:
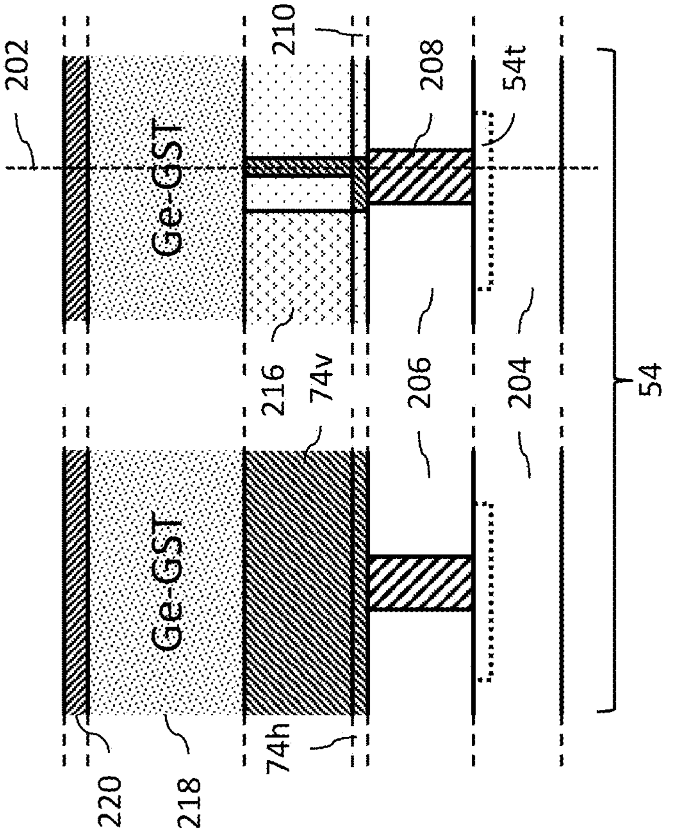

FIGS. 5F-1 and 5F-2—the etch mask 224 is then removed and a wafer cleaning process (for example, a standard clean as known to those skilled in the art) is performed.

Figures 2, 5G:
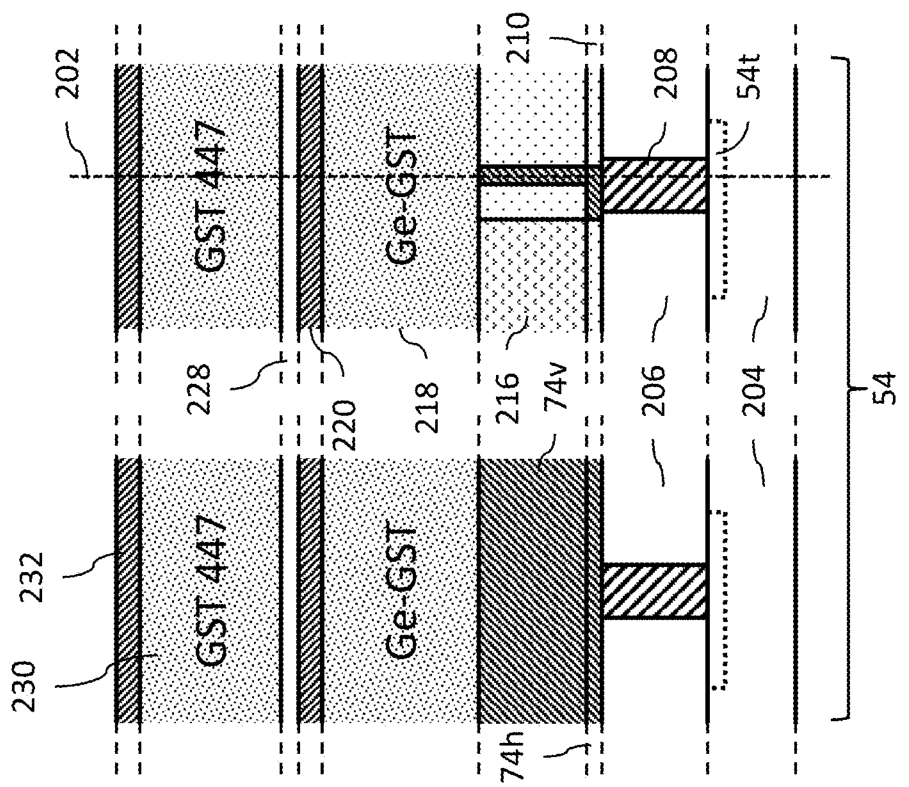
Figures 1, 5G:
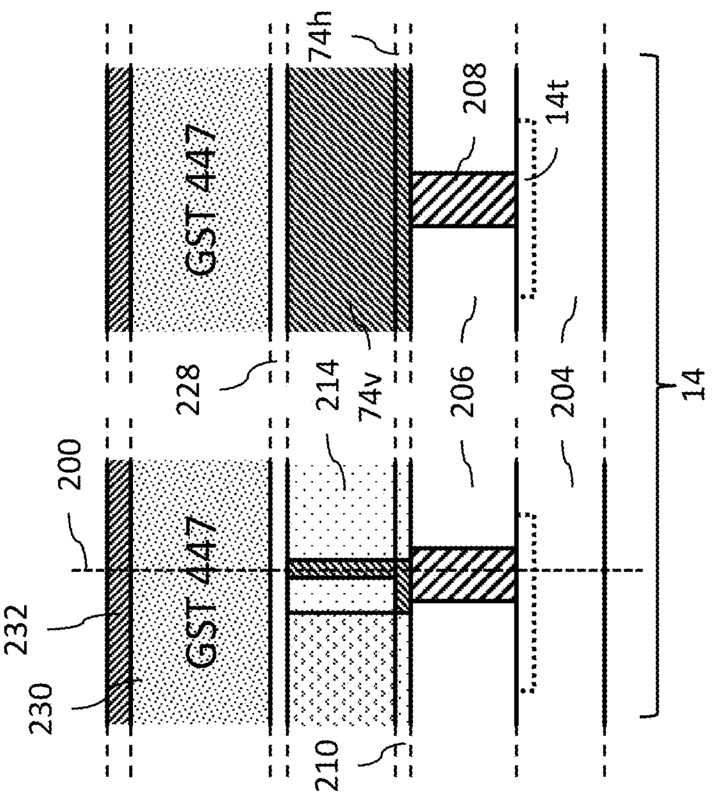

FIGS. 5G-1 and 5G-2—a layer 228 of an electrically resistive material is blanket deposited on top of the L-shaped first electrode 74 within the insulating region 80 in the area where the PCM cells 14 are located and on top of the layer 220 of titanium nitride (TiN) in the area where the PCM cells 54 are located. The electrically resistive material of layer 228 may, for example, comprise Titanium, Titanium Nitride, Tungsten, Carbon alloys (doped with Silicon, Nitrogen or other dopant), or a doped polysilicon. The selection of the material for the layer 228 is preferably a material whose resistance is thermally stable. Reference is made, for example, to U.S. Pat. No. 11,227,992 (incorporated herein by reference). Next, a layer 230 of a rheostatic (or stoichiometric) GST alloy (for example, the GST 225 alloy ($Ge_2Sb_2Te_5$) or the GST 447 alloy ($Ge_4Sb_4Te_7$) which comprises a preferred alloy) is blanket deposited on top of the layer 228 of electrically resistive material. Next, a layer 232 of titanium nitride (TiN) is blanket deposited on top of the layer 230 of the stoichiometric GST alloy. The layer 232 will eventually form the second electrode 76 for the memory cells 14.

The layer 228 of electrically resistive material is a component part of the rheostatic memory cell 12, but it will be noted that the inclusion of the layer 228 may also be helpful to address concerns with the efficacy of the surface cleaning of the wafer (FIG. 5F-1) that is performed after the etched removal of the layer 218 of the germanium rich GST alloy. For example, that surface cleaning may not produce a surface finish in the area where the PCM cells 14 are located that is sufficiently clean to ensure electrical continuity between the L-shaped first electrode 74 and the deposited layer 230 of the GST alloy.

Figures 2, 5H:
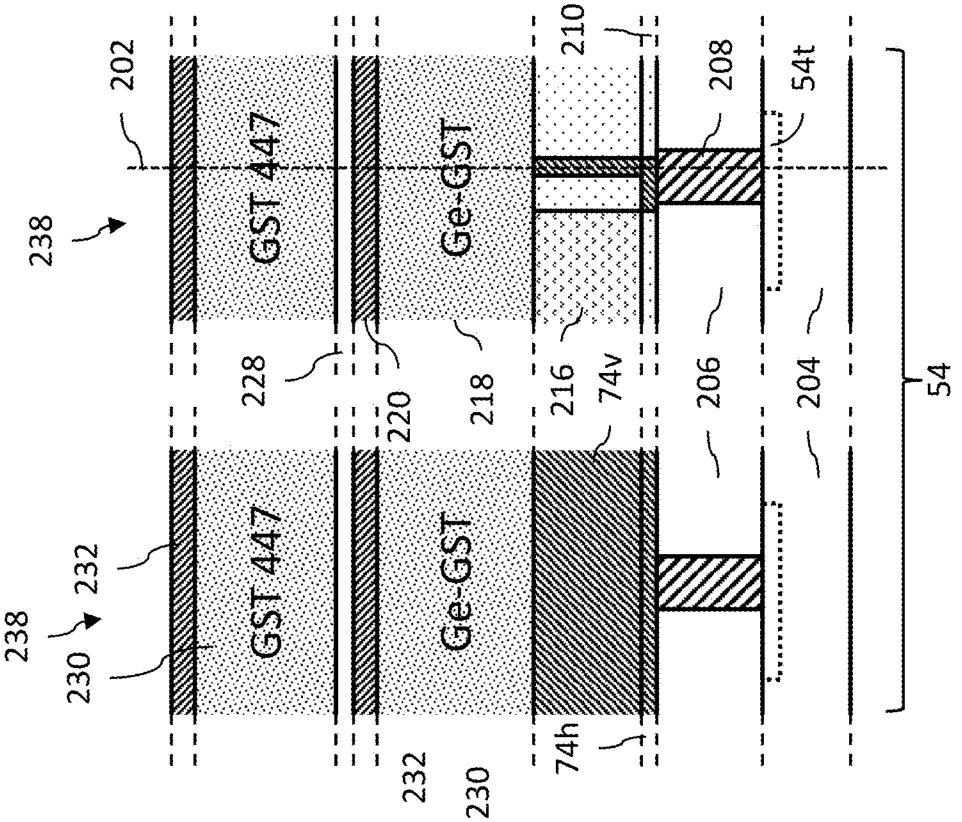
Figures 1, 5H:
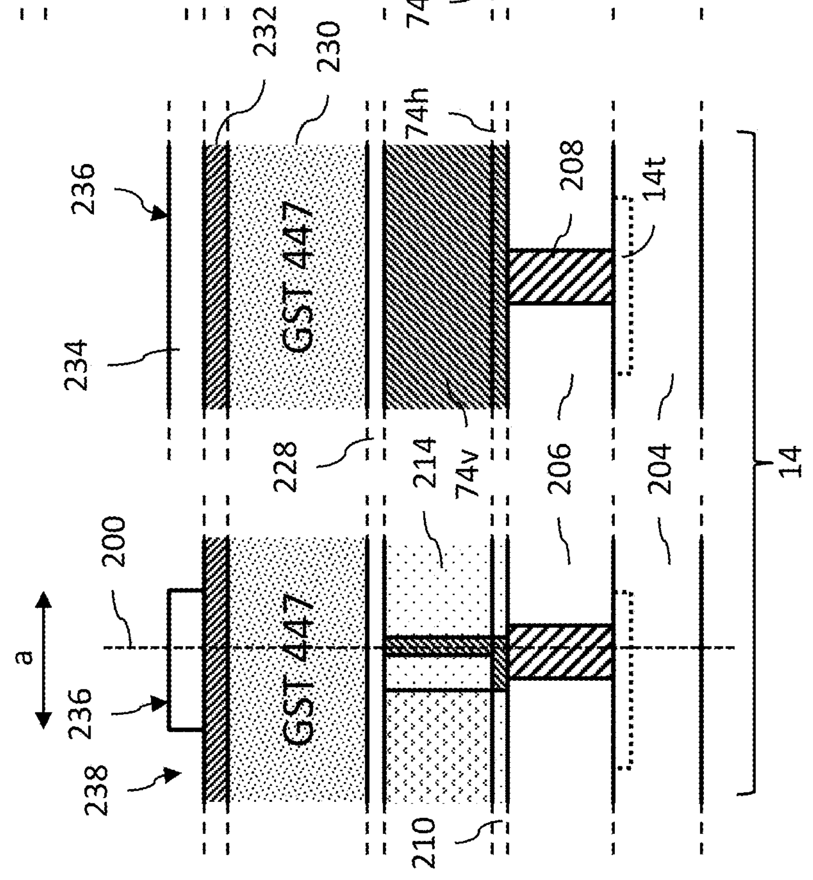

FIGS. 5H-1 and 5H-2—a masking layer 234 is then blanket deposited on top of the layer 232 and lithographically patterned to form an etch mask 236 partially covering the PCM cells 14 (but not covering at all the PCM cells 54). The partial covering by the etch mask 236 includes an opening 238 to delimit in the x direction (left side of FIG. 5H-1) the size "a" of the PCM cell 14.

Figures 1, 5I:
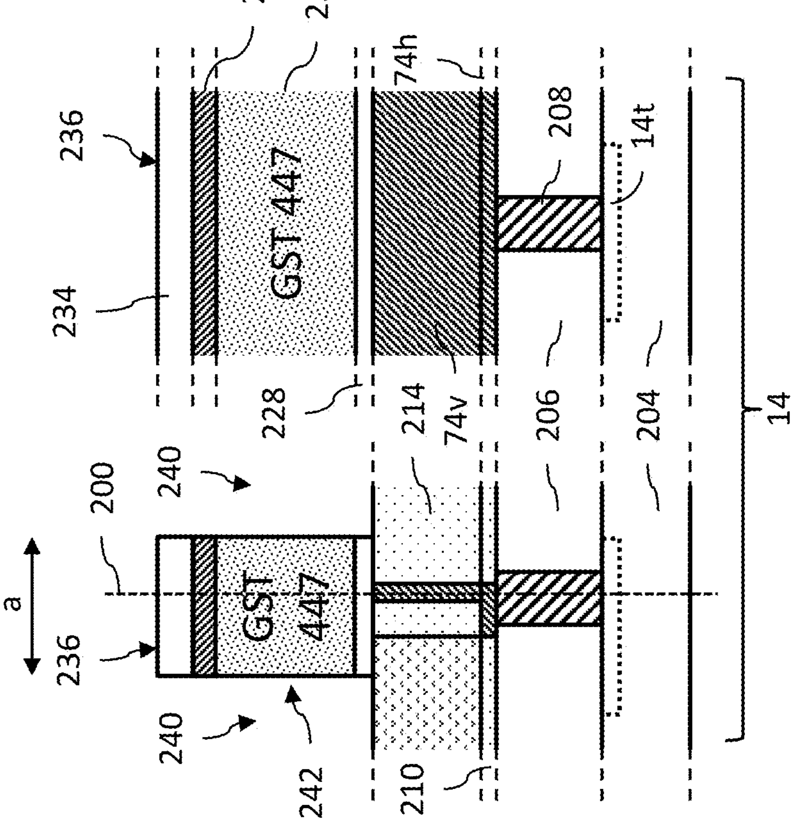
Figures 2, 5I:
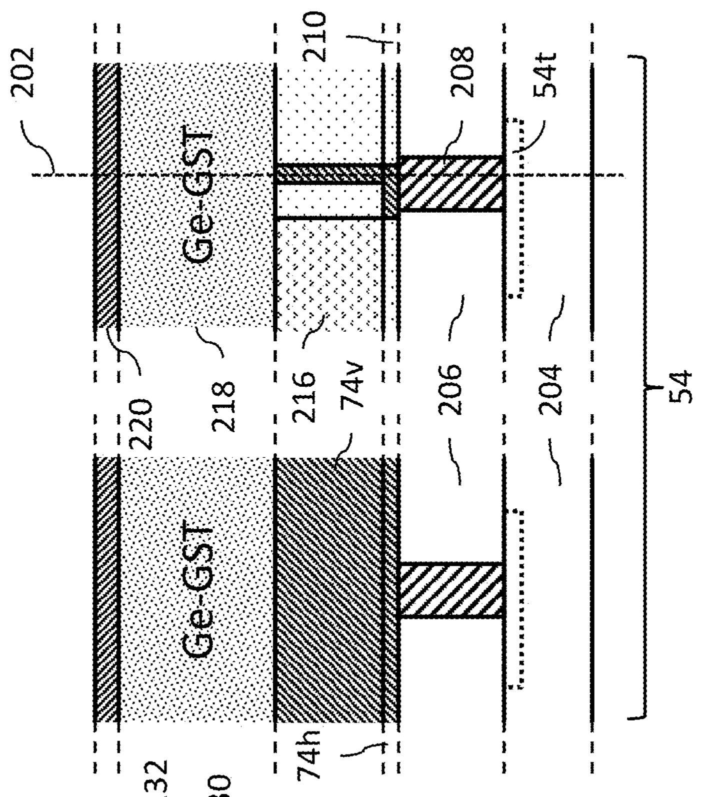

FIGS. 5I-1 and 5I-2—one or more etching operations are then performed through the opening 238 in the etch mask 236 to: i) remove, in the area where the PCM cells 54 are located, the layer 232 of titanium nitride (TiN), the layer 230 of the stoichiometric GST alloy, and the layer 228 of electrically resistive material which are not covered by the etch mask 236; and ii) remove, in the area where the PCM cells 14 are located, the portions of the layer 232 of titanium nitride (TiN), the layer 230 of the stoichiometric GST alloy, and the layer 228 of electrically resistive material which are not covered by the etch mask 236. The etch leaves openings 240 in the area where the PCM cells 14 are located that are adjacent the delimited size "a" for a stack 242 of the layers 228, 230, 232 in the x direction for the PCM cell 14. The etching operation stops when silicon nitride material from the region 214 is reached.

Figures 2, 5J:
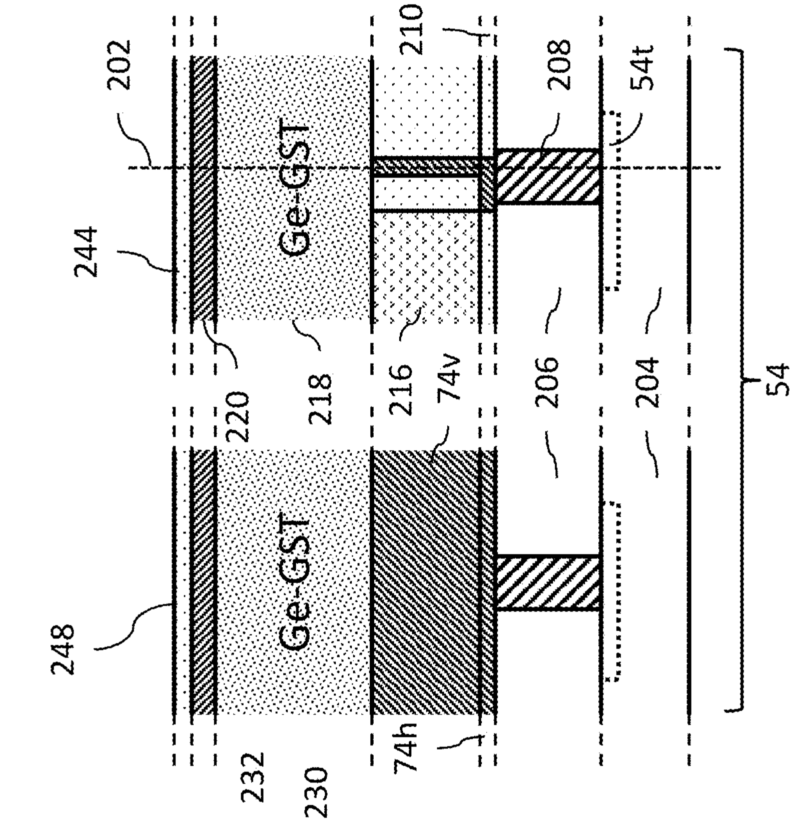
Figures 1, 5J:
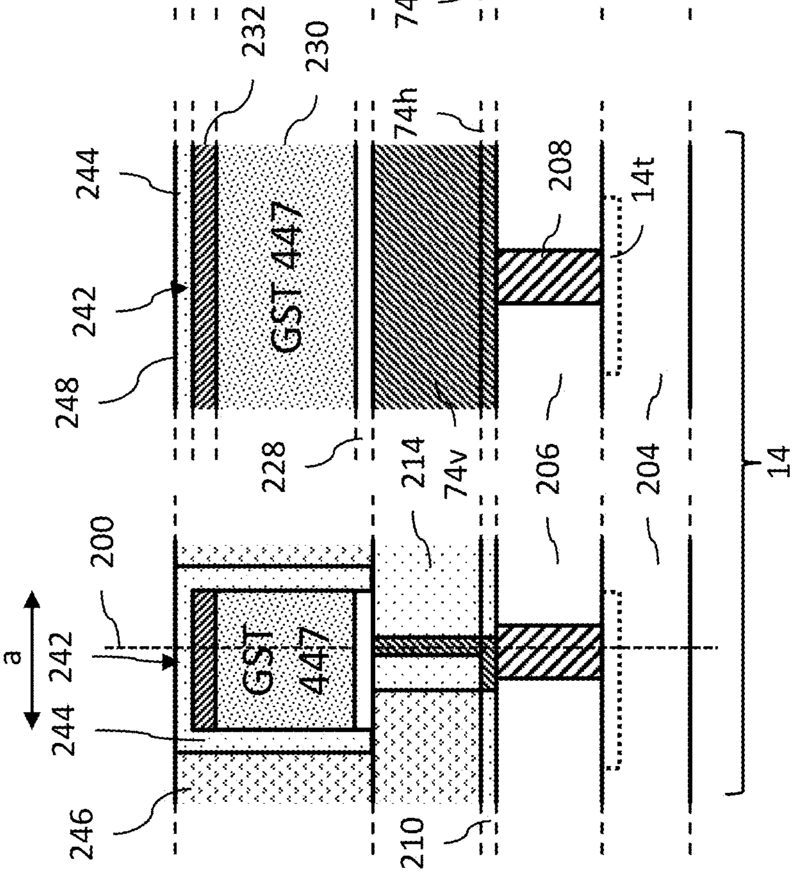

FIGS. 5J-1 and 5J-2—after removing the mask 236, the top surface and the sidewalls of the stack 242 in the area where the PCM cells 14 are located, as well as the top surface of layer 220 in the area where the PCM cells 54 are located, are then lined/covered with a layer 244 of silicon nitride and the remainder of the openings 240 is filled with a silicon oxide fill 246. A planarization operation using a CMP process is then performed to remove excess silicon nitride and silicon oxide and provide a planar top surface 248.

Figures 1, 2, 5K:
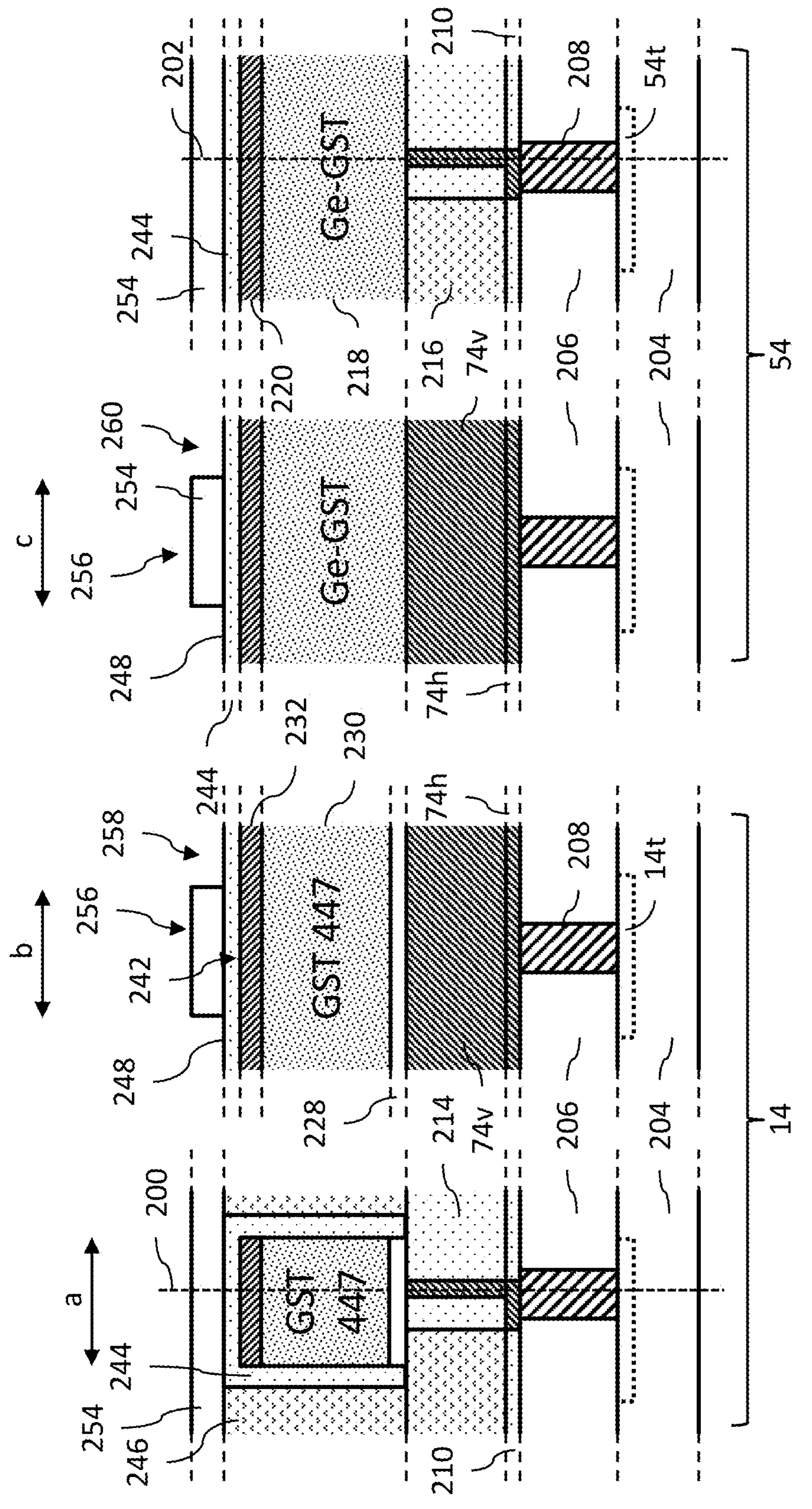

FIGS. 5K-1 and 5K-2—a masking layer 254 is then blanket deposited on top of the planar surface 248 provided by layer 244 and fill 246 and lithographically patterned to form an etch mask 256 partially covering the PCM cells 14 and the PCM cells 54. The partial covering by the etch mask 256 includes an opening 258 to delimit in the y direction (right side of FIG. 5K-1) the size "b" of the PCM cell 14 and an opening 260 to delimit in the x direction (left side of FIG. 5K-2) the size "c" of the PCM cell 14.

Figures 1, 2, 5L:
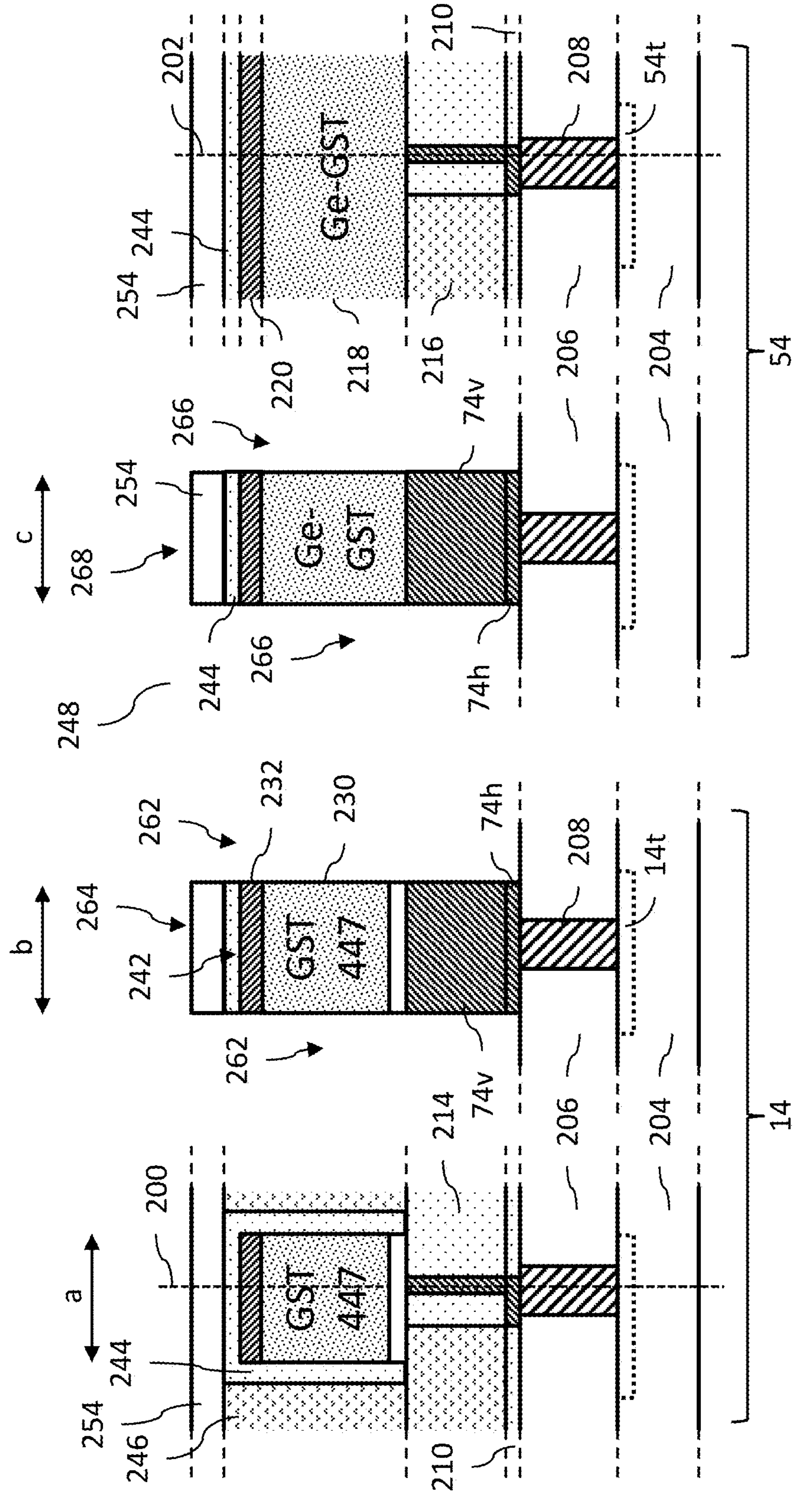

FIGS. 5L-1 and 5L-2—one or more etching operations are then performed through the openings 258 and 260 in the etch mask 256 to: i) remove, in the area where the PCM cells 14 are located, the layer of silicon oxide 244, the layer 232 of titanium nitride (TiN), the layer 230 of the stoichiometric GST alloy, the layer 228 of electrically resistive material, and parts of the vertical **74*v* and horizontal 74*h* portions of the heater that are not covered by the mask 256; and ii) remove, in the area where the PCM cells 54 are located, the layer of silicon oxide 244, the layer 220 of titanium nitride (TiN), the layer 218 of the germanium rich GST alloy, and parts of the vertical 74*v* and horizontal 74*h* portions of the heater that are not covered by the mask 256. The etch leaves openings 262 in the area where the PCM cells 14 are located that are adjacent the delimited size "b" for a stack 264 of the layers 244, 232, 230, 228 and 74 in the y direction for the PCM cell 14, and leaves openings 266 in the area where the PCM cells 54 are located that are adjacent the delimited size "c" for a stack 268 of the layers 244, 220, 218 and 74 in the x direction for the PCM cell 54. The etching operation stops when the material of the premetallization dielectic layer 206** is reached. A wafer clean may then be performed.

Figures 1, 2, 5M:
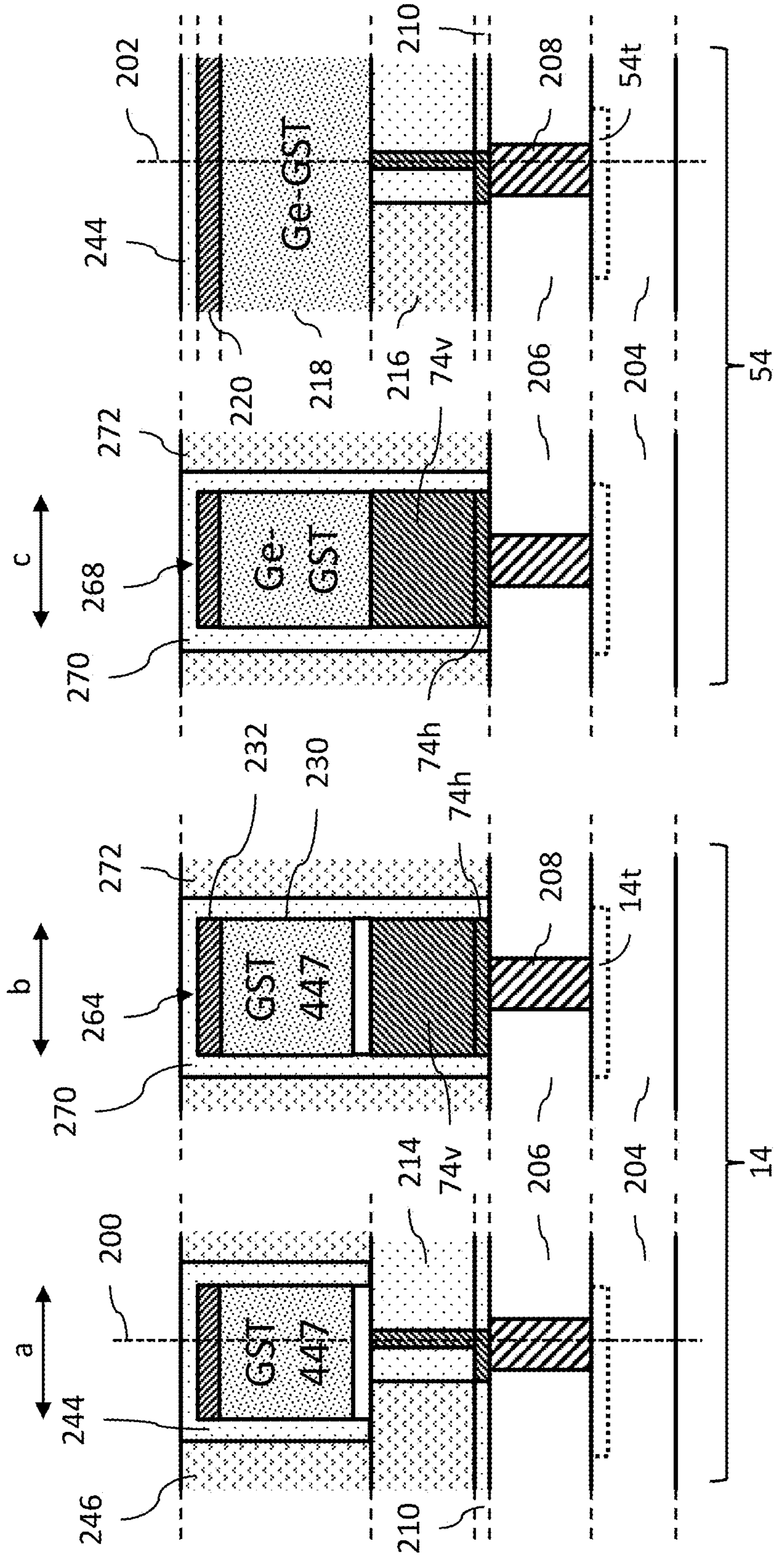
Figure 6A:
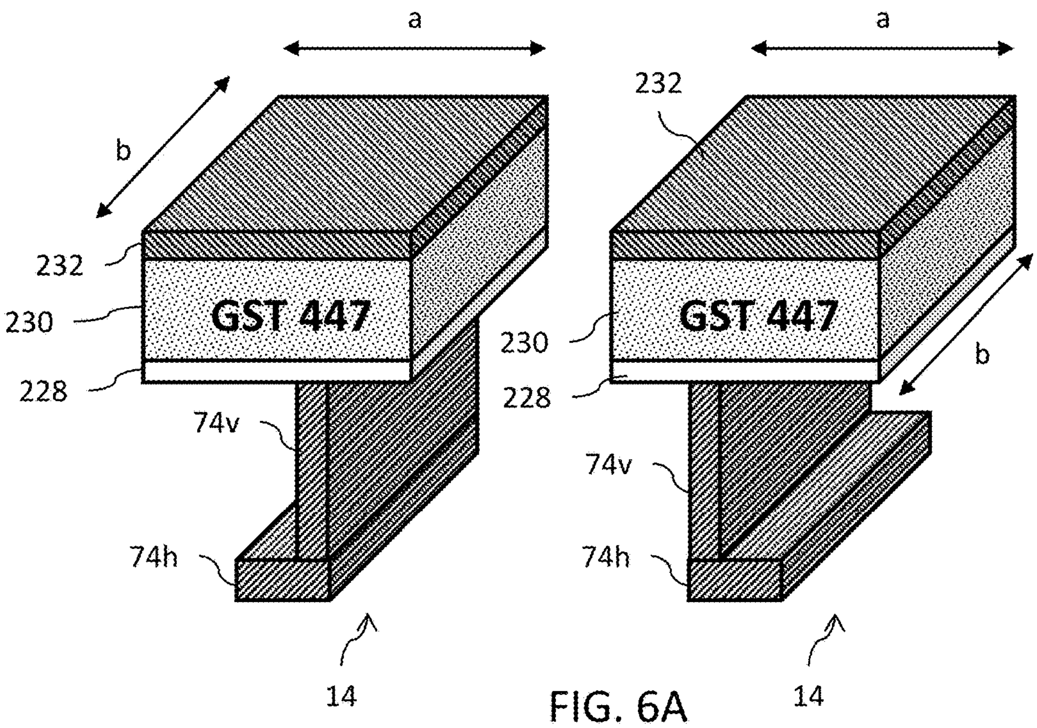
FIGS. 6A and 6B show perspective views of the PCM cells formed by the process of FIGS. 5A-1 to 5N-1 and 5A-2 to 5N-2.
Figure 6B:
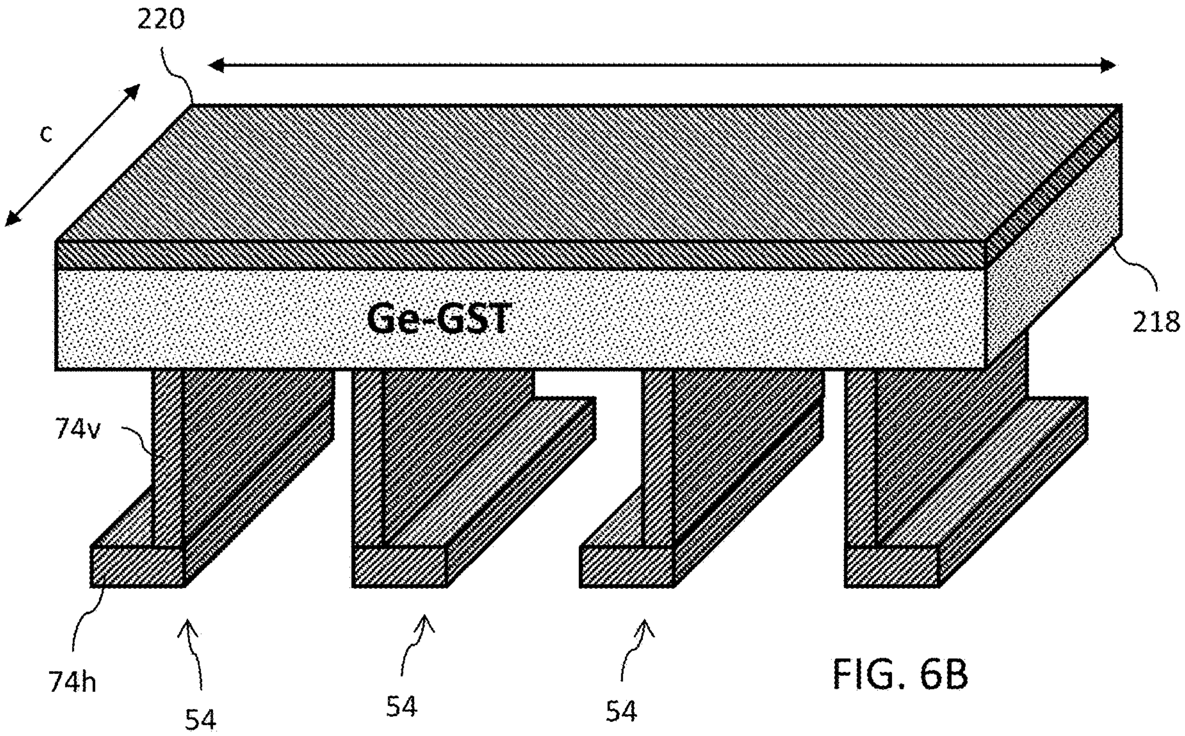

FIGS. 5M-1 and 5M-2—after removing the mask 256, the sidewalls of the stack 264 in the area where the PCM cells 14 are located, as well as the sidewalls of the stack 268 in the area where the PCM cells 54 are located, are then lined with a layer 270 of silicon nitride and the remainder of the openings 262 and 266 is filled with a silicon oxide fill 272. A planarization operation is performed to remove excess silicon nitride and silicon oxide and provide a planar top surface. It will be noted that the memory cells 14 are now delimited on all four sides (in both the x and y directions) by SiN insulating material (244, 270) such that each cell includes its own memory region 72 with associated phase change portion 78 that is isolated from the memory regions of other cells (see, FIGS. 4 and 6A). This is referred to in the art, for example, as a "fully confined cell" implementation (see, also, U.S. Pat. No. 11,227,992) where the materials 244, 246, 270 and 272 for the cell 14 provide a galvanic isolation as well as a thermal barrier separating adjacent rheostatic cells 14 from each other in the memory array 12. The rheostatic cell is fully confined in the x and y directions (two dimensions) because in order to obtain the full amorphous state (that represents a weight=0) it is needed that the amorphized region cover the whole cell region (region 78 width is greater than cell critical dimension). If the cell 14 were instead confined in only one dimension, as is shown for the cells 54 of the array 52, it would be impossible to obtain an amorphous volume for region 78 that extends up to the edge of the cell. For the cells 54 used in the backup storage area it is not necessary to have full confinement (in two dimensions) as these cells lack the lamina provided by layer 228 and highly resistive amorphous state is obtained solely through the formation of a volume of amorphous material above the heater. Thus, the memory cells 54 are delimited on two sides (in the x direction) by SiN insulating material (270) such that multiple cells in the y-direction share a common memory region 72 with plural phase change portions 78 (see, FIGS. 4 and 6B).

Figures 2, 5N:
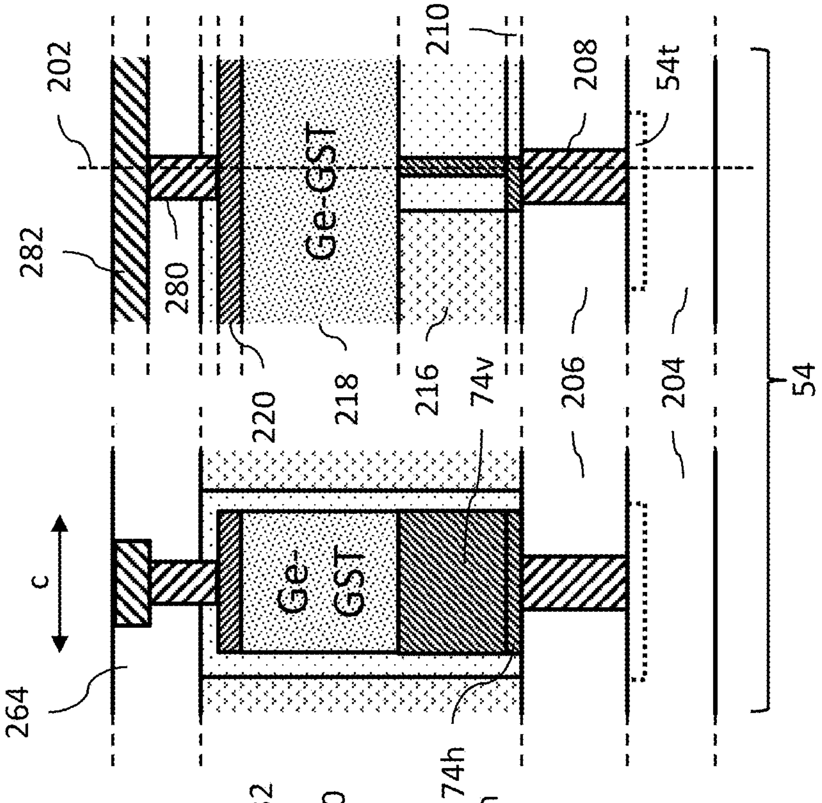
Figures 1, 5N:
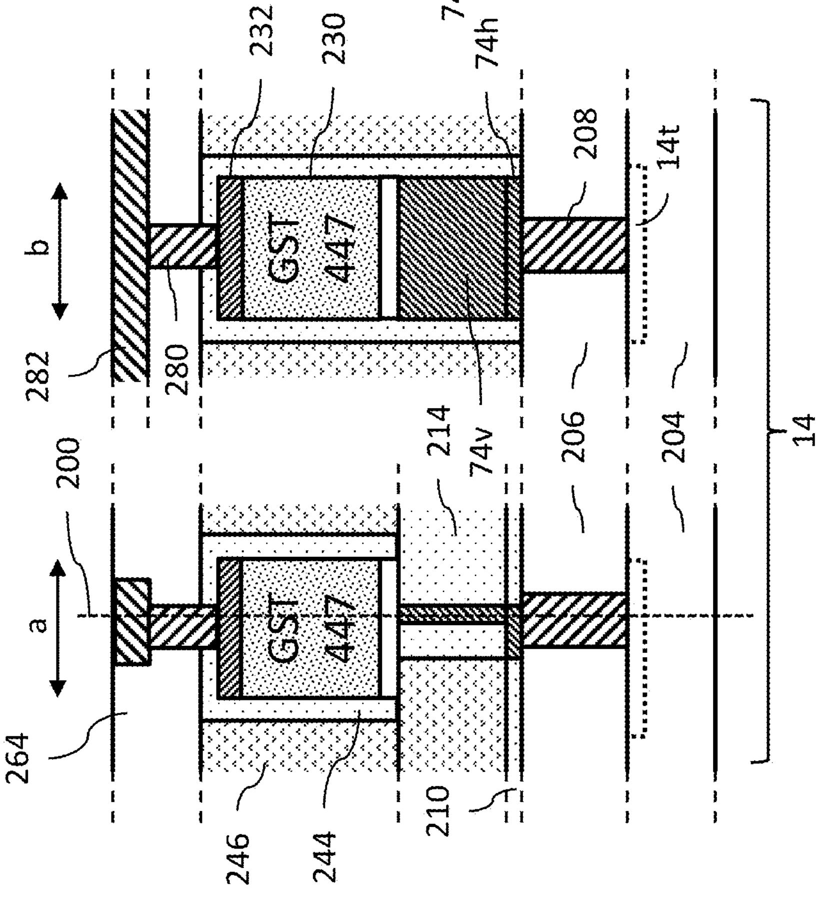

FIGS. 5N-1 and 5N-2—conventional metallization layer formation is then performed to provide vias 280 and metal lines 282 with dielectric material 264 to make electrical contact to the layer 232 for PCM cells 14 and the layer 22 for PCM cells 54.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An in-memory computation (IMC) system, comprising: an in-memory computation circuit including a first phase change memory (PCM) array configured to store computational weights, wherein the first PCM memory is configured to multiply the computational weights by received feature data to perform an in-memory computation operation; wherein the first PCM array comprises PCM cells made of a phase change material comprising a first GST alloy; a data storage circuit including a second PCM array configured to store backup data for the computational weights for the in-memory computation operation; and wherein the second PCM array comprises PCM cells made of a phase change material comprising a second GST alloy different from the first GST alloy; wherein the first GST alloy is a stoichiometric GST alloy and the second GST alloy is a germanium rich GST alloy.

2. The IMC system of claim 1, further comprising a control circuit configured to read the backup data from the second PCM array and write to the first PCM array to refresh the computational weights for the in-memory computation operation from said backup data.

3. The IMC system of claim 2, wherein the computational weights comprise m-ary data stored in each PCM cell of the first PCM array, m being an integer greater than or equal to three, and wherein the backup data comprise binary data stored in each PCM cell of the second PCM array.

4. The IMC system of claim 3, wherein the control circuit is further configured to convert the binary data of the backup data to m-ary data for the computational weights.

5. The IMC system of claim 1, wherein the stoichiometric GST alloy is selected from the group consisting of a GST 225 alloy ($Ge_2Sb_2Te_5$) and a GST 447 alloy ($Ge_4Sb_4Te_7$), and wherein the germanium rich GST alloy comprises a stoichiometric percentage of germanium that is greater than or equal to 50%.

6. The IMC system of claim 5, wherein the germanium rich GST alloy further comprises a stoichiometric percentage of nitrogen in a range of 5-25%.

7. The IMC system of claim 1, wherein the in-memory computation operation is a matrix vector multiplication operation.

8. The IMC system of claim 1, wherein the in-memory computation circuit with the first PCM array and the data storage circuit including the second PCM array are all provided on a common semiconductor substrate.

9. An in-memory computation (IMC) system, comprising:

an in-memory computation circuit including a first phase change memory (PCM) array configured to store the computational weights for an in-memory computation operation;

wherein the first PCM array comprises PCM cells made of a phase change material comprising a first GST alloy;

a data storage circuit including a second PCM array configured to store backup data for the computational weights for the in-memory computation operation; and wherein the second PCM array comprises PCM cells made of a phase change material comprising a second GST alloy different from the first GST alloy;

wherein the first GST alloy is a stoichiometric GST alloy and the second GST alloy is a germanium rich GST alloy.

10. The IMC system of claim 9, further comprising a control circuit configured to read the backup data from the second PCM array and write to the first PCM array to refresh the computational weights for the in-memory computation operation from said backup data.

11. The IMC system of claim 10, wherein the computational weights comprise m-ary data stored in each PCM cell of the first PCM array, m being an integer greater than or equal to three, and wherein the backup data comprise binary data stored in each PCM cell of the second PCM array.

12. The IMC system of claim 11, wherein the control circuit is further configured to convert the binary data of the backup data to m-ary data for the computational weights.

13. The IMC system of claim 9, wherein the stoichiometric GST alloy is selected from the group consisting of a GST 225 alloy ($Ge_2Sb_2Te_5$) and a GST 447 alloy ($Ge_4Sb_4Te_7$), and wherein the germanium rich GST alloy comprises a stoichiometric percentage of germanium that is greater than or equal to 50%.

14. The IMC system of claim 13, wherein the germanium rich GST alloy further comprises a stoichiometric percentage of nitrogen in a range of 5-25%.

15. The IMC system of claim 9, wherein the in-memory computation operation is a matrix vector multiplication operation.

16. The IMC system of claim 1, wherein the in-memory computation circuit with the first PCM array and the data storage circuit including the second PCM array are all provided on a common semiconductor substrate.

* * * * *